(12) United States Patent
Nishihara et al.

(10) Patent No.: US 7,872,548 B2
(45) Date of Patent: Jan. 18, 2011

(54) ANTENNA DUPLEXER

(75) Inventors: Tokihiro Nishihara, Kawasaki (JP); Masafumi Iwaki, Kawasaki (JP); Shinji Taniguchi, Kawasaki (JP); Masanori Ueda, Kawasaki (JP); Go Endo, Yokohama (JP); Koichi Hatano, Yokohama (JP)

(73) Assignee: Taiyo Yuden Co., Ltd, Tokyo (JP)

( * ) Notice: Subject to any disclaimer, the term of this patent is extended or adjusted under 35 U.S.C. 154(b) by 0 days.

(21) Appl. No.: 12/106,888

(22) Filed: Apr. 21, 2008

(65) Prior Publication Data

US 2008/0284540 A1 Nov. 20, 2008

(30) Foreign Application Priority Data

Apr. 20, 2007 (JP) ............................. 2007-111995

(51) Int. Cl.
*H03H 9/72* (2006.01)
*H03H 9/64* (2006.01)
(52) U.S. Cl. ........................................ 333/133; 333/193
(58) Field of Classification Search ................ 333/133, 333/193, 194, 195, 196
See application file for complete search history.

(56) References Cited

U.S. PATENT DOCUMENTS

| 7,053,731 | B2 | 5/2006 | Iwamoto et al. |
| 7,135,944 | B2 * | 11/2006 | Iwamoto et al. ............. 333/133 |
| 7,298,231 | B2 * | 11/2007 | Ikuta et al. ................... 333/133 |
| 7,573,354 | B2 * | 8/2009 | Nishihara et al. ........... 333/133 |

FOREIGN PATENT DOCUMENTS

| JP | 3778902 B2 | 3/2006 |
| JP | 2007074698 A * | 3/2007 |

* cited by examiner

*Primary Examiner*—Dean O Takaoka
(74) *Attorney, Agent, or Firm*—Arent Fox LLP

(57) ABSTRACT

An antenna duplexer is provided, which can be built with a smaller size and lower height than ever without compromising out-of-band attenuation characteristic and isolation characteristic between a transmit terminal and a receive terminal. The antenna duplexer includes a transmit filter provided between an antenna terminal and the transmit terminal, and a receive filter provided between the antenna terminal and the receive terminal. The filters are enclosed by a package, in which a ground pattern for the receive filter is separated from other ground patterns.

12 Claims, 18 Drawing Sheets

ANTENNA DUPLEXER

CROSS-REFERENCE TO RELATED APPLICATION

This application claims the priority of Japanese Patent Application No. 2007-111995, filed Apr. 20, 2007, which is incorporated in its entirety herewith by reference.

BACKGROUND OF THE INVENTION

1. Field of the Invention

The present invention relates to an antenna duplexer that separates a transmit signal and a receive signal.

2. Description of the Related Art

The recent development of mobile communication system has realized rapid popularization of mobile phones, portable information terminals and the like. In the field of the mobile phone, multiband and multimode systems are rapidly spreading, and besides accessorial wireless interface functions such as wireless LAN, Bluetooth, or GPS are being added one after another. Such situation is provoking a strong demand for further reduction in dimensions and higher integration level of RF circuits in the mobile phone and hence, in turn, a greater demand is arising for reduction in dimensions, lower cost yet higher performance of an antenna duplexer, which is one of the major components of the RF circuit.

The antenna duplexer is employed for separating a transmit signal and a receive signal of different frequencies, and includes a filter for transmission and a filter for reception. These filters often include a one terminal-pair resonator shown in FIG. 17. As to the resonator, large-sized dielectric resonators which have been widely used are recently being replaced with small-sized piezoelectric thin film resonators or surface acoustic wave resonators. In addition, boundary wave resonators have lately been developed. The structure of the resonators will be described hereunder.

FIG. 18(a)-(b) illustrates the basic structure of the piezoelectric thin film resonator. FIG. 18(a) is a plan view of the piezoelectric thin film resonator 500, and FIG. 18(b) is a cross-sectional view taken along the line II-II in FIG. 18(a).

The piezoelectric thin film resonator 500 includes a lower electrode layer 502, a piezoelectric layer 503, and an upper electrode layer 501 stacked over a hollow 505 formed in a substrate 504, made of silicon for example. The upper electrode layer 501 serves as an input terminal 506, and the lower electrode layer 502 serves as an output terminal 507. The piezoelectric layer 503 is constituted of, for example, aluminum nitride. The hollow 505 may be formed by perforating a through hole from the lower surface of the substrate 504 as shown in FIG. 18(b), or may be a cavity formed on the surface of the substrate 504 utilizing a sacrificial layer.

FIG. 18(c)-(d) illustrates the basic structure of another piezoelectric thin film resonator. FIG. 18(c) is a plan view of the piezoelectric thin film resonator 510, and FIG. 18(d) is a cross-sectional view taken along the line III-III in FIG. 18(a).

The piezoelectric thin film resonator 510 includes an acoustic multilayer 515 (hereinafter, simply "multilayer") constituted of high acoustic impedance layers and low acoustic impedance layers alternately stacked, in place of the hollow 505 in the piezoelectric thin film resonator 500, and a lower electrode layer 512, a piezoelectric layer 513, and an upper electrode layer 511 are stacked over the multilayer. The resonant frequency of the piezoelectric thin film resonator 510 is determined by the thickness of the multilayer 515 and propagation speed of vertical vibration in a thicknesswise direction.

FIG. 19(a)-(b) illustrates the basic structure of the surface acoustic wave resonator. FIG. 19(a) is a plan view of the surface acoustic wave resonator 520, and FIG. 19(b) is a cross-sectional view taken along the line IV-IV in FIG. 19(a).

The surface acoustic wave resonator 520 includes interdigital transducers (hereinafter abbreviated as IDT) 521 located on a piezoelectric substrate 524 and connected to an input terminal 526 and an output terminal 527, and reflectors 522 located on the respective sides of the IDT 521. The IDT 521 and the reflector 522 are formed on a metal, for example aluminum (Al). FIGS. 19(a) and 19(b) depict fewer numbers of the electrode teeth of the reflector 522 and the IDT 521, than what they really are. The resonant frequency of the surface acoustic wave resonator 520 is determined by the electrode pitch of the IDT 521 and propagation speed of the surface acoustic wave.

FIG. 20(a)-(b) illustrates the basic structure of the boundary wave resonator. FIG. 20(a) is a plan view of the boundary wave wave resonator 530, and FIG. 20(b) is a cross-sectional view taken along the line V-V in FIG. 20(a).

The boundary wave wave resonator 530 has a similar basic structure to that of the surface acoustic wave resonator 520, and the difference is that the former includes two types of dielectric layers 538, 539 over IDT 531 and a reflector 532. The resonant frequency of the boundary wave resonator 530 is determined by the electrode pitch of the IDT 531 and propagation speed of the boundary wave.

Hereunder, the filter for transmission or for reception will now be described.

FIG. 21 is a circuit diagram for explaining a ladder-type filter employed in the filter for transmission or reception.

The ladder-type filter 540 includes a plurality of the foregoing one terminal-pair resonator, connected so as to form a serial arm and a parallel arm, and is widely used as the filter for transmission or reception. The ladder-type filter 540 has the advantage that the bandwidth can be broadened with relatively low loss and high attenuation can be attained in the vicinity of the passing band, and of high power-withstanding capability. In addition, a longitudinal mode coupled filter is also widely employed. The longitudinal mode coupled filter generally includes, as basic structure, a double mode type surface acoustic wave filter (DMS: Double Mode SAW) as shown in FIGS. 22 and 23.

FIG. 22 is a schematic diagram for explaining the double mode type surface acoustic wave filter of an unbalanced type.

The unbalanced double mode type surface acoustic wave filter 550 includes a plurality of input IDTs 551 and output IDTs 553 provided on a piezoelectric substrate (not shown), and reflectors 552 located on an outer side of the IDTs. The double mode type surface acoustic wave filter 550 can constitute a filter having excellent attenuation over a broad bandwidth and a balanced/unbalanced conversion function.

FIG. 23 is a schematic diagram for explaining the balanced/unbalanced-convertible double mode type surface acoustic wave filter.

The balanced/unbalanced-convertible double mode type surface acoustic wave filter 560 includes an unbalanced type input terminal and a balanced type output terminal. In the filter 560, one of the output IDTs 563' is oriented opposite to the other output IDT 563, so as to form the output terminal of the balanced type. Except for this aspect, the double mode type surface acoustic wave filter 560 is the same as the unbalanced double mode type surface acoustic wave filter 550.

As described earlier regarding the boundary wave resonator 530, the double mode type filter can be used as a double mode type boundary wave filter, upon providing the two types of dielectric layers on the IDT.

The following passages describe the antenna duplexer. FIG. 24 is a block diagram for explaining a basic structure of the antenna duplexer.

The antenna duplexer 601 serves to separate a transmit signal and a receive signal of different frequencies. For such purpose, the antenna duplexer 601 includes a transmit filter 602, a receive filter 603, a matching circuit 604, an antenna terminal 607, a transmit terminal 608, and a receive terminal 609. The transmit signal is input through the transmit terminal 608, passes through the transmit filter 602 and the matching circuit 604, and is output through the antenna terminal 607. The receive signal is input through the antenna terminal 607, passes through the matching circuit 604 and the receive filter 603, and is output through the receive terminal 609.

The matching circuit 604 is provided between the antenna terminal 607 and the two filters 602, 603, to prevent the increase of leak loss of the transmit and receive signal. Specifically, the matching circuit 604 increases the impedance of the transmission band in the receive filter 603, to thereby inhibit the transmit signal input through the transmit terminal 608 from deviating to the receive filter 603 and being output to the side of the receive terminal 609, and also increases the impedance of the transmit filter 602, to thereby inhibit the receive signal input through the antenna terminal 607 from deviating to the transmit filter 602 and being output to the side of the transmit terminal 608. Here, the antenna duplexer 601 is constituted of components integrated as a unit, such that the transmit filter 602, the receive filter 603 and the matching circuit 604 are accommodated in a package, and the antenna terminal 607, the transmit terminal 608 and the receive terminal 609 are provided on the outer periphery of the package.

With respect to the latest mobile phones, the demand for higher attenuation and higher isolation characteristic from the antenna duplexer has grown stronger than ever, owing to various factors such as the spread of multiband/multimode system, expanding variation of accessorial wireless interface functions, decreased use of interstage filters, and so forth.

To increase the out-of-band attenuation and improve the isolation characteristic, the layout of the ground pattern in the package plays a critical role. Generally, a large common ground is formed inside the package or on a surface where a footpad is provided (hereinafter, "footpad surface"), to thereby reinforce the ground.

FIG. 25 depicts an internal structure of an antenna duplexer disclosed in JP-B-3778902.

The antenna duplexer 701 includes a multilayer package 710 and a filter chip 740 face-down mounted therein. FIG. 26 is a circuit diagram of the antenna duplexer 701. In this conventional structure, the package 710 includes six layers, in which a plurality of ground patterns 770 serving as a large common ground is provided. Accordingly, the antenna duplexer becomes considerably large in dimensions, for example 3.8 mm×3.8 mm×1.4 mm (1.4 mm is the height).

With respect to the antenna duplexer, as already stated, reduction in dimensions including height is keenly required, in addition to higher performance. However, attempting to reduce the dimensions including the height of the package imposes difficulty in securing a sufficient space for arranging the ground pattern.

Moreover, in the field of semiconductor devices, equilibration of circuits in devices such as a mixer of a receiving circuit or a low noise amplifier (LNA) is being promoted, for improvement of noise characteristic, for example against a crosstalk between the devices. The antenna duplexer to be connected with such semiconductor devices is also required to have a balanced receive terminal. In the antenna duplexer having a balanced receive terminal, the balanced/unbalanced-convertible longitudinal mode coupled filter is often employed as the receive filter. The attenuation in the transmission band and isolation characteristic are quite susceptible to the layout of the ground pattern of the longitudinal mode coupled filter, and therefore special attention has to be paid to the layout of the ground pattern.

SUMMARY OF THE INVENTION

The present invention has been accomplished in view of the foregoing situation, with an object to provide an antenna duplexer that can be built in a smaller size and lower height than ever without compromise in attenuation and isolation characteristic, by achieving an innovative ground pattern layout of the package.

A first aspect of the present invention provides an antenna duplexer comprising a transmit filter provided between an antenna terminal and a transmit terminal, and a receive filter provided between the antenna terminal and a receive terminal, with the transmit filter and the receive filter being mounted in a package. A ground pattern for the receive filter is separated from another ground pattern provided in the package.

In the foregoing antenna duplexer, since the ground pattern for the receive filter is separated from another ground pattern in the package, it becomes easier to improve the isolation characteristic between the terminals in the package as proven through experiments to be described later, which facilitates improving the out-of-band attenuation and the isolation characteristic of the antenna duplexer. Such structure also eliminates the need to form a large common ground in the package for reinforcing the ground, thereby enabling the reduction in dimensions, including height, of the antenna duplexer.

Preferably, the package may include a cavity portion that accommodates therein the transmit filter and the receive filter, and a seal ring portion, and the seal ring portion may be connected to the ground pattern for the receive filter.

With such structure that the seal ring portion is connected to the ground pattern for the receive filter, the isolation characteristic between the terminals in the package can be improved than in the case where the seal ring portion is connected to another ground pattern, as proven through the experiments to be described later. This leads to improved out-of-band attenuation and isolation characteristic.

Preferably, the connection of the seal ring portion and the ground pattern for the receive filter may be made through a conductor pattern including a side castellation formed on an inner wall of the package. Here, the side castellation refers to an electrical connection path constituted of a conductor layer provided in a groove formed on the inner or outer wall of the package. The side castellation serves to electrically connect a metal lid and the seal ring with the conductor pattern such as the ground pattern, and the footpad.

Such structure allows connecting, via a relatively short distance, the footpad on the ground on the back of the package, which is a stable ground, with the seal ring portion and the metal lid mounted thereon, thereby facilitating efficiently reinforcing the ground potential of the seal ring portion and the metal lid mounted thereon, thus resulting in improved out-of-band attenuation and isolation characteristic.

In the foregoing antenna duplexer, preferably the connection of the seal ring portion and the ground pattern for the receive filter may be made through a conductor pattern including a side castellation formed on an outer wall of the package.

Such structure allows directly connecting the footpad on the ground on the back of the package, which is a stable ground, with the seal ring portion and the metal lid mounted thereon, without the intermediation of the ground pattern inside the package having an unstable ground potential, thereby facilitating efficiently reinforcing the ground potential of the seal ring portion and the metal lid mounted thereon, thus resulting in improved out-of-band attenuation and isolation characteristic.

In the foregoing antenna duplexer, preferably the package includes at least two side castellations.

Such structure allows efficiently reinforcing the ground potential of the seal ring portion and the metal lid mounted thereon, thus resulting in improved out-of-band attenuation and isolation characteristic.

In the foregoing antenna duplexer, preferably a sidewall of the cavity portion may include a plurality of layers, the side castellations formed on the respective layers may be connected through a connection pattern formed on a boundary between the layers, and at least a part of the side castellation or of the connection pattern may be oriented so as to oppose the footpad for the ground of the receive filter formed on a lower face of the package.

Such structure allows connecting, via a relatively short distance, the footpad on the ground on the back of the package, which is a stable ground, with the seal ring portion and the metal lid mounted thereon, thereby facilitating efficiently reinforcing the ground potential of the seal ring portion and the metal lid mounted thereon, thus resulting in improved out-of-band attenuation and isolation characteristic.

In the foregoing antenna duplexer, preferably the facing portion includes at least a part of the side castellation directly connected to a die-attach surface where the transmit filter and the receive filter in the cavity portion are mounted.

Such structure allows connecting, via an even shorter distance, the footpad on the ground on the back of the package, which is a stable ground, with the seal ring portion and the metal lid mounted thereon, thereby facilitating efficiently reinforcing the ground potential of the seal ring portion and the metal lid mounted thereon, thus resulting in improved out-of-band attenuation and isolation characteristic.

In the foregoing antenna duplexer, preferably at least a part of the side castellation may be directly connected to the footpad for the ground of the receive filter.

Such structure allows connecting, via an even shorter distance, the footpad on the ground on the back of the package, which is a stable ground, with the seal ring portion and the metal lid mounted thereon, thereby facilitating efficiently reinforcing the ground potential of the seal ring portion and the metal lid mounted thereon, thus resulting in improved out-of-band attenuation and isolation characteristic.

In the foregoing antenna duplexer, preferably the ground pattern of the transmit filter may include a conductor pattern on the die-attach surface in the package, a conductor pattern formed on a lower layer surface of the die-attach surface, and a via that connects the two conductor patterns. Such structure allows forming an inductor having a relatively larger value for the transmit filter ground than an inductor for the receive filter ground, from two conductor patterns, thereby facilitating designing the layout.

In the foregoing antenna duplexer, preferably the ground pattern of the receive filter may include a conductor pattern on the die-attach surface in the package, a conductor pattern formed on a lower layer surface of the die-attach surface, and a via that connects the two conductor patterns. Such structure facilitates forming an inductor of a relatively smaller value for the receive filter ground than the inductor for the transmit filter ground, by enlarging the two conductor patterns.

In the foregoing antenna duplexer, preferably the ground pattern of the receive filter may include at least two vias. Such structure facilitates attaining an inductor of a smaller value for the receive filter ground. Besides, it becomes easier to adjust the value of the inductors for each ground of a plurality of double mode type filters according to the layout or the number of the vias, which leads to improved attenuation in the transmission band and isolation characteristic.

In the foregoing antenna duplexer, preferably the ground for the receive filter may include at least two footpads, in the package. Such structure facilitates attaining an inductor of a smaller value for the receive filter ground.

In the foregoing antenna duplexer, preferably at least two vias may be connected to at least one of the footpads for the the receive filter ground, in the package. Such structure facilitates attaining an inductor of a smaller value for the receive filter ground. Besides, it becomes easier to adjust the value of the inductors for each ground of a plurality of double mode type filters according to the layout and the number of the vias, which leads to improved attenuation in the transmission band and isolation characteristic.

A second aspect of the present invention provides an antenna duplexer comprising a transmit filter provided between an antenna terminal and a transmit terminal, and a receive filter provided between the antenna terminal and a balanced receive terminal, with the transmit filter and the receive filter being mounted in a package. The transmit filter is a ladder-type filter, and the receive filter includes a plurality of parallelly connected double mode type filters, and a plurality of resonators serially connected between the double mode type filter and the antenna terminal. Such structure provides an antenna duplexer of reduced loss, higher attenuation and higher power-withstanding capability.

In the antenna duplexer according to the second aspect, preferably the transmit filter includes a plurality of serial resonators located on the side of the antenna terminal. Such structure allows improving the power-withstanding capability, and linearity of inter-modulation distortion (hereinafter, IMD) of the antenna duplexer.

In the foregoing antenna duplexer, preferably the resonator constituting the ladder-type transmit filter may be a piezoelectric thin film resonator. Such structure allows reducing the loss of the transmit filter, which is severely required in general.

Preferably, the foregoing antenna duplexer may further comprise an in inductor connected in parallel between a common coupling point of the transmit filter and the receive filter, and the antenna terminal. Such structure allows matching an impedance on the antenna terminal side with a fewer number of elements, thereby enabling reducing the loss, as well as the dimensions of the antenna duplexer.

Preferably, the foregoing antenna duplexer may further comprise a notch circuit serially connected between the common coupling point of the transmit filter and the receive filter and the antenna terminal. Such structure enables simultaneous attenuation in the transmit filter and the receive filter, thereby improving the efficiency. Moreover, the improvement in attenuation leads to improved linearity of the IMD and harmonic distortion.

Other features and advantages of the present invention will become more apparent through the detailed description given hereunder referring to the accompanying drawings.

DETAILED DESCRIPTION OF THE PREFERRED EMBODIMENTS

Embodiments of the present invention will be described below with reference to the accompanying drawings.

Figure 1:
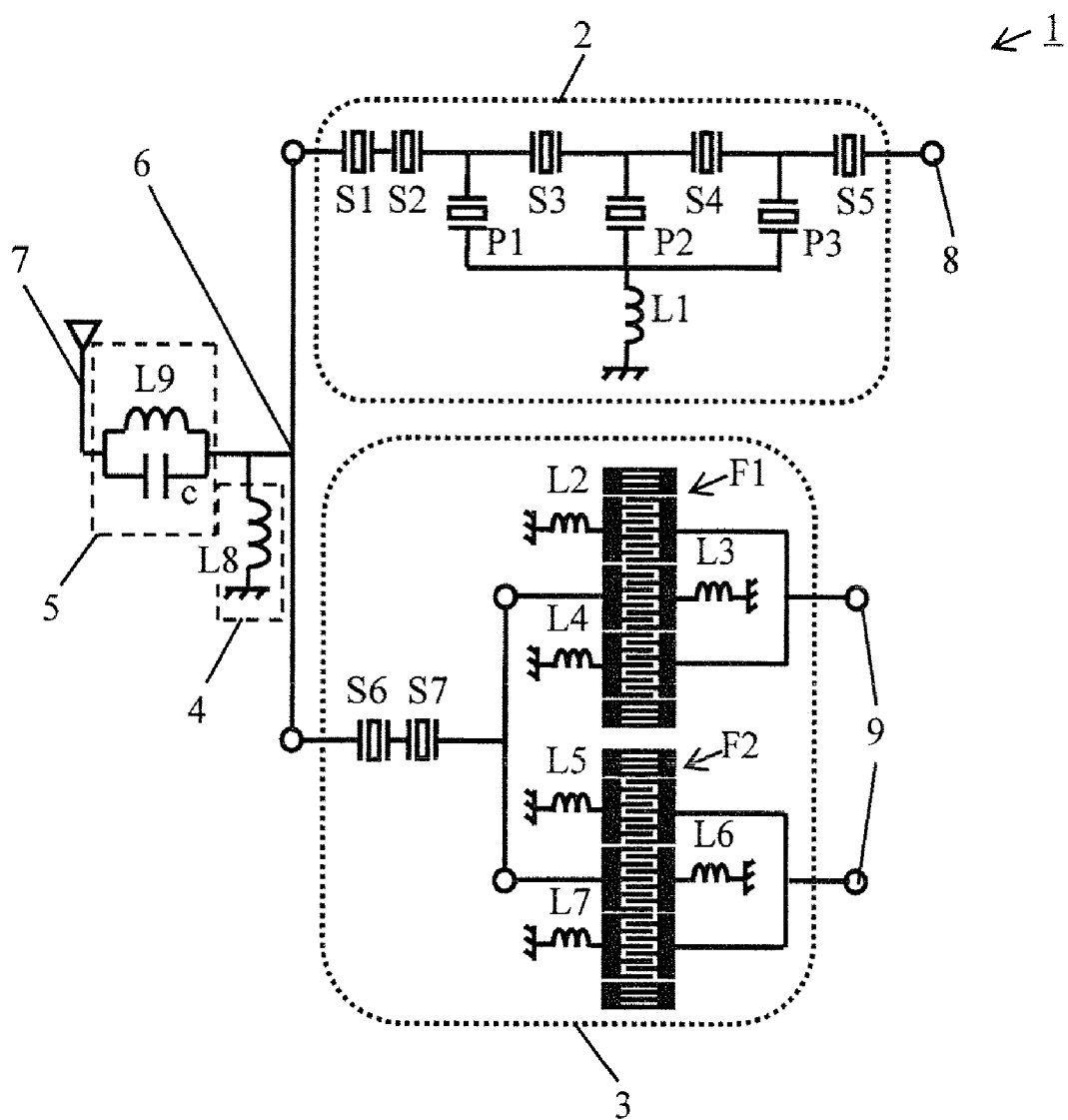
FIG. 1 is a circuit diagram of an antenna duplexer according to a first embodiment of the present invention.

FIG. 1 is a circuit diagram of an antenna duplexer according to a first embodiment of the present invention. The antenna duplexer 1 includes a transmit filter 2, a receive filter 3, a matching circuit 4, and a notch circuit 5.

The transmit filter 2 is a ladder-type filter including five serial resonators S1 to S5 and three parallel resonators P1 to P3, and a piezoelectric thin film resonator is employed as each of the resonators S1 to S5 and P1 to P3. The three parallel resonators P1 to P3 are commonized on the side of the ground, and then connected to an inductor L1. The inductor L1 is constituted of a conductor pattern including a via, in the package. In this embodiment, two serial resonators S1, S2 are connected in series on the side of the antenna terminal 7 in the transmit filter 2, in order to improve the power-withstanding capability and linearity of harmonic distortion and so on of the antenna duplexer 1.

The receive filter 3 includes two double mode type surface acoustic wave filters F1, F2 which are connected in parallel, and two surface acoustic wave resonators S6, S7 connected in series to the coupling point of the filters F1, F2. The double mode type surface acoustic wave filters F1, F2 are longitudinal mode coupled filters. The respective output terminal of the double mode type surface acoustic wave filters F1, F2 constitutes a balanced receive terminal 9 of the receive filter 3. Inductors L2 to L7 of the double mode type surface acoustic wave filters F1, F2 are made up, as the inductor L1 of the transmit filter 2, from a ground pattern to which each ground point is connected. The inductors L2 to L7 have a relatively smaller inductance than the inductor L1 of the transmit filter 2. The inductors L1 to L7 are constituted, as will be described later, of the conductor pattern (ground pattern) respectively formed in two base layers in the package, and a plurality of vias connecting these patterns.

The matching circuit 4 is constituted of an inductor L8, which is an integrated passive device (hereinafter, IPD). The matching circuit 4 is connected in parallel between a common coupling point 6 of the transmit filter 2 and the receive filter 3, and the ground.

The notch circuit 5 is a parallel circuit including an inductor L9 and a capacitor C. The notch circuit 5 is constituted of an IPD. The notch circuit 5 is serially connected between the common coupling point 6 and the antenna terminal 7.

Figure 2:
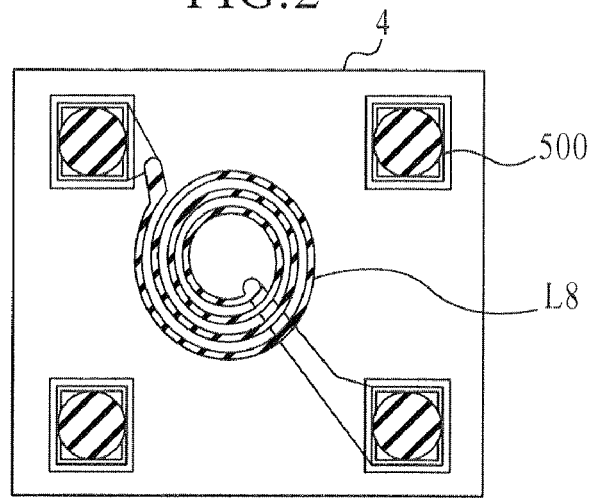
FIG. 2 is a schematic plan view of an IPD constituting a matching circuit.

FIG. 2 depicts a structure of the IPD constituting the matching circuit 4.

The IPD constituting the matching circuit 4 includes the inductor L8 constituted of a spiral-shaped line, formed on a surface of a rectangular substrate. The spiral-shaped line is made of a metal wiring such as copper (Cu). The substrate is, for example, constituted of quartz. At the four corners of the substrate a bump is respectively provided, and the ends of the inductor L8 are respectively connected to the bump at the upper left and lower right corner, for example.

Figure 3A:
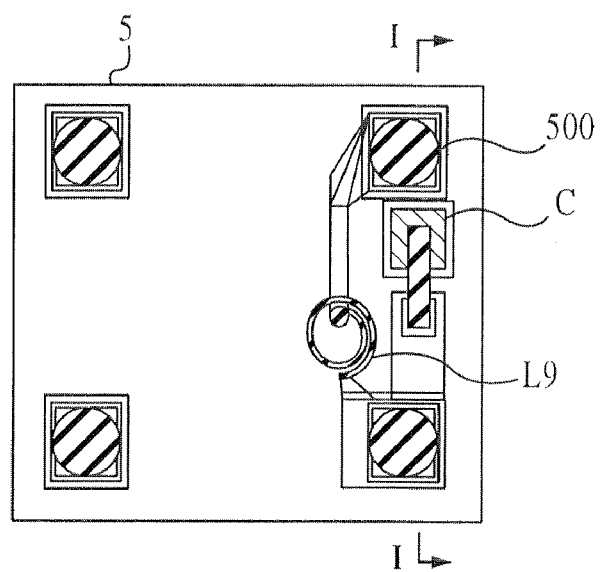
FIG. 3 shows an IPD constituting a notch circuit.
Figure 3B:
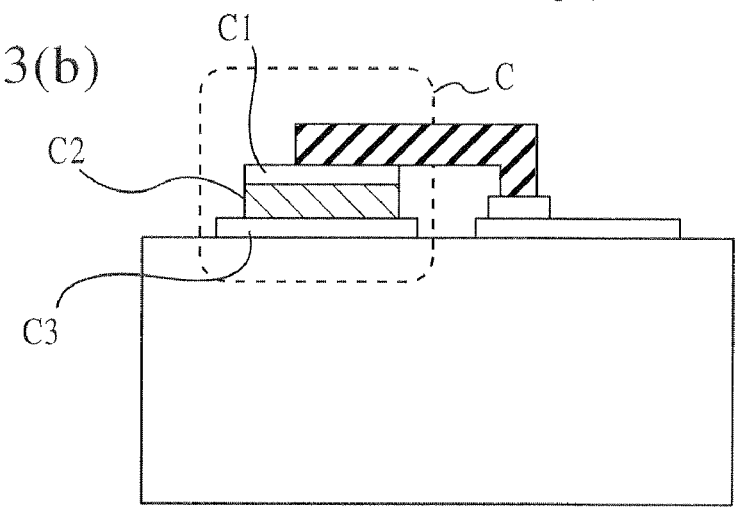

FIGS. 3(a) and 3(b) illustrates the structure of the IPD constituting the notch circuit 5. FIG. 3(a) is a schematic plan view of the IPD, and FIG. 3(b) is a cross-sectional view taken along the line I-I in FIG. 3(a).

The IPD constituting the notch circuit 5 includes a capacitor C, and the inductor L9 constituted of a spiral-shaped line, formed on a rectangular substrate. The substrate is formed of quartz for example, as the IPD of the matching circuit 4. The spiral-shaped line is made of a metal wiring such as copper (Cu). The capacitor C is of a MIM structure in which a lower electrode C3 formed on the substrate, a dielectric C2 which is, for example, a silicon oxide insulating layer, and an upper electrode C1 are stacked. At the four corners of the substrate a bump is respectively provided, and an end of the inductor L9 and an end of the capacitor C are connected, for example, to the lower right bump, and the other end of the inductor L9 and the other end of the capacitor C are connected to the upper right bump, for example.

Here, although the matching circuit 4 and the notch circuit 5 respectively constituted of the IPD are independently shown in FIGS. 2, 3(*a*) and 3(*b*), these circuits may be unified with a single IPD.

The number of resonators employed in the transmit filter 2 and the receive filter 3 is not limited to the number shown in FIG. 1. Also, each resonator may be one of a piezoelectric thin film resonator, a surface acoustic wave resonator, and a boundary wave resonator. The receive filter 3 may be a longitudinal mode coupled filter of a different type, and the number of filter to be connected in parallel is not specifically determined. Further, a cascade connection may be adopted. The longitudinal mode coupled filter may employ boundary wave.

It suffices that the matching circuit 4 is capable of matching the impedance, and hence a capacitor may be employed instead of the inductor. Also, the matching circuit 4 may be constituted of a circuit in which a plurality of inductors or capacitors connected in parallel or series. In the case where the matching can be achieved by connecting the inductor in parallel to the resonators on the side of the common coupling point 6, namely S1, S2, of the transmit filter 2 or or S6, S7 of the receive filter 3, the matching circuit 4 may be excluded. Also, the matching circuit 4 may be located between the common coupling point 6 and the transmit filter 2 or between the common coupling point 6 and the receive filter 3, instead of between the antenna terminal 7 and the common coupling point 6. Further, another matching circuit may be provided between the common coupling point 6 and the transmit filter 2 or between the common coupling point 6 and the receive filter 3, in addition to the matching circuit 4.

Although the notch circuit 5 is inserted between the common coupling point 6 and the antenna terminal 7 in this embodiment, a circuit other than the parallel LC resonant circuit may be employed as the notch circuit, or a high-pass filter (HPF) or low-pass filter (LPF) may be employed according to the band where the attenuation has to be assured. It is to be noted that in the case where the attenuation at a specific band is not necessary, those circuits may be omitted.

Now, a package including the antenna duplexer 1 according to this embodiment will be described. The transmit filter 2, the receive filter 3, the matching circuit 4, and the notch circuit 5 shown in FIG. 1 are respectively realized in a form of a chip component, and hence the chip component of the corresponding circuit will be given the same numeral in the following description. For example, a transmit filter chip, a receive filter chip, an IPD chip for the matching circuit, and an IPD chip for the notch circuit will be denoted as "transmit filter chip 2", "receive filter chip 3", "matching circuit IPD chip 4", and "notch circuit IPD chip 5", respectively.

Figure 4:
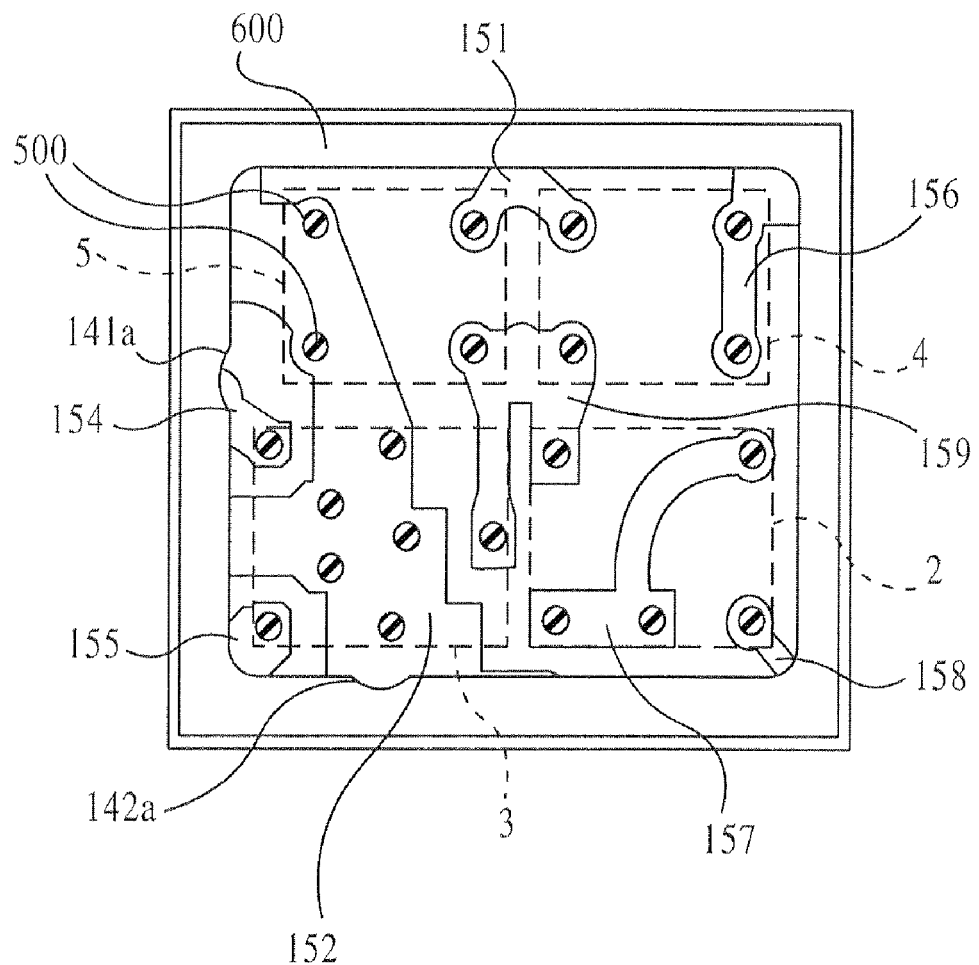
FIG. 4 is a schematic plan view for explaining the internal layout of the antenna duplexer according to the first embodiment.

FIG. 4 is a schematic plan view for explaining the internal layout of the antenna duplexer according to this embodiment, showing a structure that the transmit filter chip 2 to the notch circuit IPD chip 5 are face-down mounted on a die-attach surface of the package. The chips 2 to 5 are indicated by broken lines.

Figure 5:
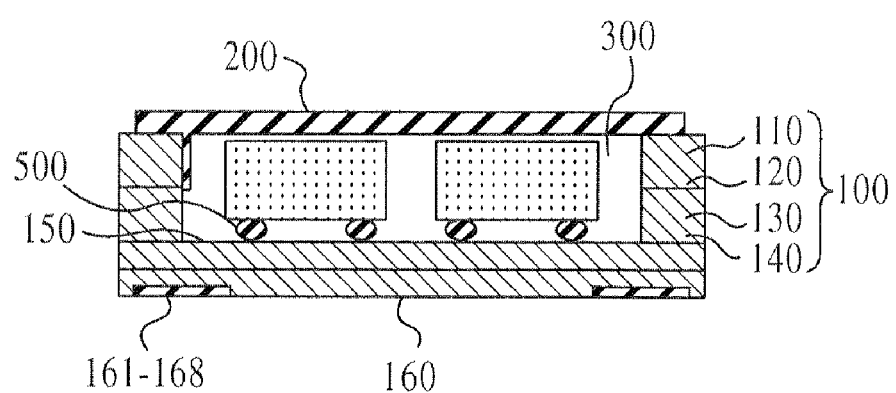
FIG. 5 is a cross-sectional view for explaining the internal structure of the antenna duplexer according to the first embodiment.
Figure 6:
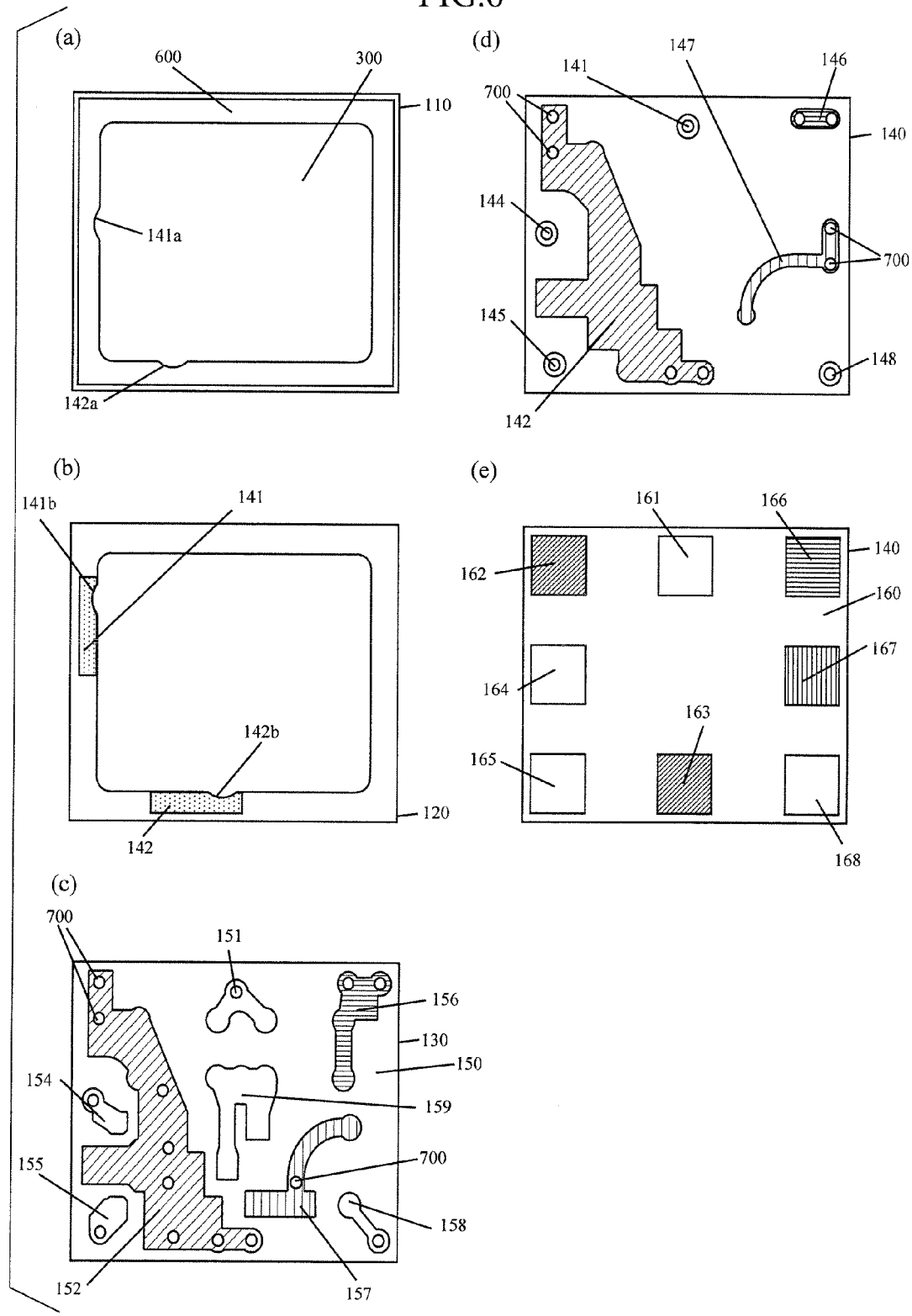
FIG. 6 illustrates the layout of the conductor pattern for the antenna duplexer according to the first embodiment.

FIG. 5 is a cross-sectional view for explaining the internal structure of the antenna duplexer 1. FIG. 6(*a*) to 6(*e*) are schematic plan views for explaining the layout of the conductor pattern in each layer of the antenna duplexer 1.

As shown in FIG. 5, the package 100 is constituted of, for example, alumina ceramic, glass ceramic, or the like. The package 100 includes four layers, namely a first cavity layer 110 and a second cavity layer 120 that define a cavity 300 in which the transmit filter chip 2 to the notch circuit IPD chip 5 are mounted, and a first base layer 130 and a second base layer 140 that serve as the base for mounting the chips 2 to 5. Though not shown in FIG. 5, a conductor pattern predominantly composed of tungsten (W), copper (Cu) or silver (Ag) is formed in the package 100. The conductor pattern will be described later. Also, externally exposed portion is plated with a metal such as nickel (Ni) or gold (Au).

Referring to FIG. 6, the layout and other details of the conductor pattern of each layer will be described hereunder.

As shown in FIG. 6(*a*), a conductor pattern of a seal ring 600 is provided on the upper surface of the first cavity layer 110. Via the conductor pattern, a metal lid 200 constituted of a metal material such as kovar is attached over the upper surface of the package 100, so as to air-tightly encapsulate the chips 2 to 5 mounted in the cavity 300.

On inner walls of the first cavity layer 110 (left inner wall and lower inner wall in FIG. 6(*a*)), side castellations 141*a*, 142*a* are provided and, as shown in FIG. 6(*b*), on inner walls of the second cavity layer 120 (left inner wall and lower inner wall in FIG. 6(*b*)) also, side castellations 141*b*, 142*b* are provided. The side castellations 141*a*, 142*a*, 141*b*, 142*b* serve to electrically connect the metal lid 200 and the seal ring 600 to the conductor pattern of the first base layer 130 and the second base layer 140.

The side castellation 141*a* of the first cavity layer 110 and the side castellation 141*b* of the second cavity layer 120 are located at different positions. The intention of the difference is preventing the solder from dripping when soldering the seal ring 600 on the upper surface of the first cavity layer 110. The side castellation 141*a* of the first cavity layer 110 and the side castellation 141*b* of the second cavity layer 120 are connected via a connection conductor pattern 141 on the upper surface of the second cavity layer 120. Likewise, side castellation 142*a* of the first cavity layer 110 and the side castellation 142*b* of the second cavity layer 120 are connected via a connection conductor pattern 142 on the upper surface of the second cavity layer 120.

Although two side castellations are provided for each of the first cavity layer 110 and the second cavity layer 120 in this embodiment, to thereby efficiently reinforce the ground potential of the metal lid 200 and the seal ring 600, three or more side castellations may be provided.

Proceeding to FIG. 6(*c*), on the upper surface of the first base layer 130, which serves as a die-attach surface 150, various conductor patterns are provided such as a pattern 151 connected to the antenna terminal, a ground pattern 152 of the receive filter 3, patterns 154, 155 connected to the receive terminal, a ground pattern 156 of the matching circuit, a ground pattern 157 of the transmit filter, a pattern 158 connected to the transmit terminal, and a pattern 159 of the common coupling point. The transmit filter chip 2 to the notch circuit IPD chip 5 are connected to the corresponding pattern on the die-attach surface 150, via a bump 500 made of gold (Au) or solder (solid circles in FIG. 4 represent the bump 500).

Referring further to FIG. 6(*d*), on the upper surface of the second base layer 140, various conductor patterns are provided such as a pattern 141 connected to the antenna terminal, a ground pattern 142 of the receive filter 3, patterns 144, 145 connected to the receive terminal, a ground pattern 146 of the matching circuit, a ground pattern 147 of the transmit filter, and a pattern 148 connected to the transmit terminal.

In FIGS. 6(*c*) and 6(*d*), white circles represent a via 700 communicating with the lower layer. Also, among the conductor patterns provided on the first and the second base layer 130, 140, the ground patterns 152, 142 of the receive filter 3 are hatched with diagonal lines, the ground patterns 157, 147 of the transmit filter 2 are hatched with vertical lines, and the ground patterns 156, 146 of the matching circuit are hatched with horizontal lines, for visually easier distinction. In the subsequent drawings also, such hatching is provided as the case may be.

Thus, the first base layer 130 and the second base layer 140 are provided, and on the upper surface of each base layers the ground patterns are provided. Such structure allows easily forming the inductor L1 (Ref. FIG. 1) of the transmit filter 2, which has to have a relatively large value. On the other hand, the inductors L2 to L7 (Ref. FIG. 1) of the receive filter 3, which are required to have small values, can also be easily formed by the combination of the large ground pattern and the plurality of vias 700 (white circles in the patterns 142, 147, 152, 157).

In this embodiment, at least two vias 700 are provided, so as to give small values to the inductors L2 to L7 of the receive filter 3 (Ref. patterns 142, 152 in FIGS. 6(*c*) and 6(*d*)). Thus, appropriately designing the shape of the ground patterns 142, 147, 152, 157 as well as the number and position of the vias 700 allows relatively easily allocating optimal values to the inductor L1 of the transmit filter 2 and the inductors L2 to L7 of the receive filter 3, thereby facilitating adjusting the attenuation in the transmission/reception band and the isolation characteristic to desirable values.

Referring now to FIG. 6(*e*), on the lower surface of the second base layer 140, which is a lowermost surface of the package, footpads 161 to 168 are provided so as to serve as external connection terminals. The footpad 161 for the antenna terminal, the footpad 168 for the transmit terminal, the footpads 164, 165 for the receive terminal respectively correspond to the antenna terminal 7, the transmit terminal 8, and the receive terminal 9 in FIG. 1.

Here, FIG. 6(*e*) depicts the lower surface of the second base layer 140 seen through from the side of the upper surface, for easier understanding of the positional relationship between the conductor patterns of each base layer and the respective footpads. Also, the footpads 162, 163 for the receive filter 3 are hatched with diagonal lines, the footpad 167 for the transmit filter is hatched with vertical lines, and footpad 166 for the matching circuit is hatched with horizontal lines, for visually easier distinction.

FIG. 1 does not include the terminals (for external connection) corresponding to the footpads 162, 163 for the ground of the receive filter 3, the footpad 167 for the ground of the transmit filter 2, and the footpad 166 for the ground of the matching circuit 4. Referring to receive filter 3, in the case where the ground terminal for the external connection is to be shown in FIG. 1, two external connection terminals are to be provided, so as to correspond to the footpads 162, 163 for the ground shown in FIG. 6(*e*).

Although two footpads for the ground are provided in the receive filter 3 in this embodiment, three or more footpads may be provided. Also, though two each of vias 700 are provided for connection to the footpads 162, 163, 167 for the ground, three or more each of vias may be provided.

As shown in FIGS. 6(*c*) to 6(*e*), the conductor patterns on the die-attach surface 150 and on the upper surface of the second base layer 140, as well as the footpads on the footpad surface 160 are connected through the vias 700 provided in the first base layer 130 and the second base layer 140. In particular, the ground of the transmit filter 2 is constituted of the ground pattern 157 (hatched with vertical lines in FIG. 6(*c*)) on the die-attach surface 150 in the package 100, the ground pattern 147 (hatched with vertical lines in FIG. 6(*d*)) on the upper surface of the second base layer 140, connected with the ground pattern 157 through the via 700, and the footpad 167 (hatched with vertical lines in FIG. 6(*e*)) on the lower surface of the second base layer 140, connected with the ground pattern 147 through the via 700.

The ground of the receive filter 3 is constituted of the ground pattern 152 (hatched with diagonal lines in FIG. 6(*c*)) ground on the die-attach surface 150 in the package 100, the ground pattern 142 (hatched with diagonal lines in FIG. 6(*d*)) on the upper surface of the second base layer 140, connected to the ground pattern 152 through a plurality of vias 700, and the two footpads 162, 163 (hatched with diagonal lines in FIG. 6(*e*)) connected to the ground pattern 142 through a plurality of vias 700.

As is apparent, the ground patterns 142, 152 of the receive filter 3 are larger in area than the ground patterns 147, 157 of the transmit filter 2, and associated with a relatively larger number of vias 700. In the case of employing two double mode type filters connected in parallel in the receive filter 3 as in this embodiment, the values of the inductors L2 to L7 of the respective double mode type filters (constituted of the ground pattern) have to be adjusted according to the filter design, and such adjustment is achieved through the layout of the ground pattern including the vias. Specifically, the layout of the ground pattern of the receive filter 3, which includes the balanced receive terminal 9, is adjusted so as to achieve sufficient attenuation of the signal of the transmission band and an adequate isolation characteristic.

Here, the number of the footpads, location of each terminal, and the number of layers are to be properly selected according to the specifications. Also, the layout and the number of vias of the conductor pattern are to be properly selected according to the specifications, filter design and so on, without limitation to the structure according to this embodiment.

With the foregoing structure, the antenna duplexer 1 according to the first embodiment can be made smaller and lower in height than conventional ones. Actually, the antenna duplexer 1 of the structure according to this embodiment could be made up in dimensions of 3.0 mm×2.5 mm×0.7 mm (0.7 mm is the height), for example. Such size corresponds to approx. 26% in volume with respect to the dimensions of the above-cited conventional antenna duplexer, 3.8 mm×3.8 mm×1.4 mm (1.4 mm is the height), from which it is understood that significant reduction in size has been achieved. Especially, the reduction in height to ½ greatly contributes to the miniaturization, and hence the first embodiment may be characterized as providing a prominent effect of miniaturization by reduction in height.

Hereunder, description will be given on the isolation characteristic between the transmit terminal and the receive terminal of the antenna duplexer 1 according to the first embodiment.

Figure 7:
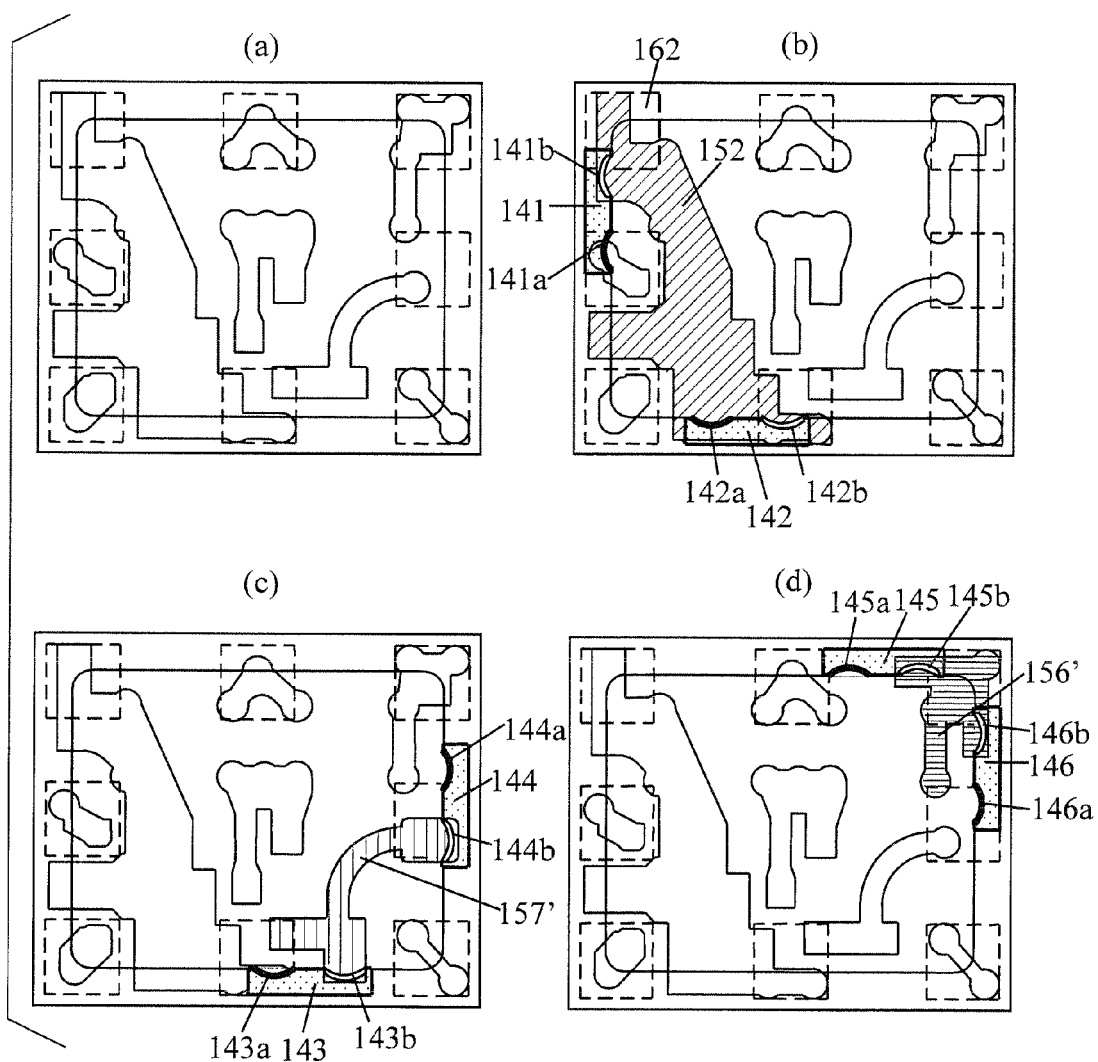
FIG. 7 shows packages with different layouts of side castellation formed on a first cavity layer and a second cavity layer.

FIG. 7(*a*) to 7(*d*) illustrates four types of packages with different layouts of the side castellation formed on the inner wall of the first cavity layer 110 and the second cavity layer 120.

FIG. 7(*a*) shows a package without the side castellation. In other words, the metal lid 200 and the seal ring 600 are electrically isolated from the conductor pattern of the first base layer 130 and the second base layer 140. FIGS. 7(*b*) to 7(*d*) depict the package with two side castellations formed on each of the inner wall of the first cavity layer 110 and that of the second cavity layer 120. The package shown in FIG. 7(*b*) corresponds to the first embodiment, and the two side castellations 141*b*, 142*b* are both connected to the ground pattern 152 of the receive filter 3, on the die-attach surface 150. In the packages shown in FIGS. 7(*c*) and 7(*d*), the two side castellations are connected to the ground pattern in the same way as in the package shown in FIG. 7(b), but are connected to a different ground pattern. More specifically, in the package of FIG. 7(c), the side castellations 143b, 144b are connected to the ground pattern 157' of the transmit filter 2, and in the package of FIG. 7(d), the side castellations 145b, 146b are connected to the ground pattern 156' of the matching circuit 4.

In FIGS. 7(a) to 7(d), the conductor patterns and the side castellations on the upper surface of the second cavity layer 120 and the first base layer 130 (die-attach surface 150), and on the lower surface of the second base layer 140 (footpad surface 160) are superposed, for easier understanding of the positional relationship among one another. The side castellation of the first cavity layer 110 is represented by solid arcuate lines, the side castellation of the second cavity layer 120 by white arcuate lines, the pattern to which the side castellation is connected by dotted sections, and the footpads by broken lines. The conductor patterns on other surfaces and the lid are excluded. This also applies to FIGS. 9(e) to 9(g), 11(h) to 11(j), and 13(k) to 13(m).

Figure 8:
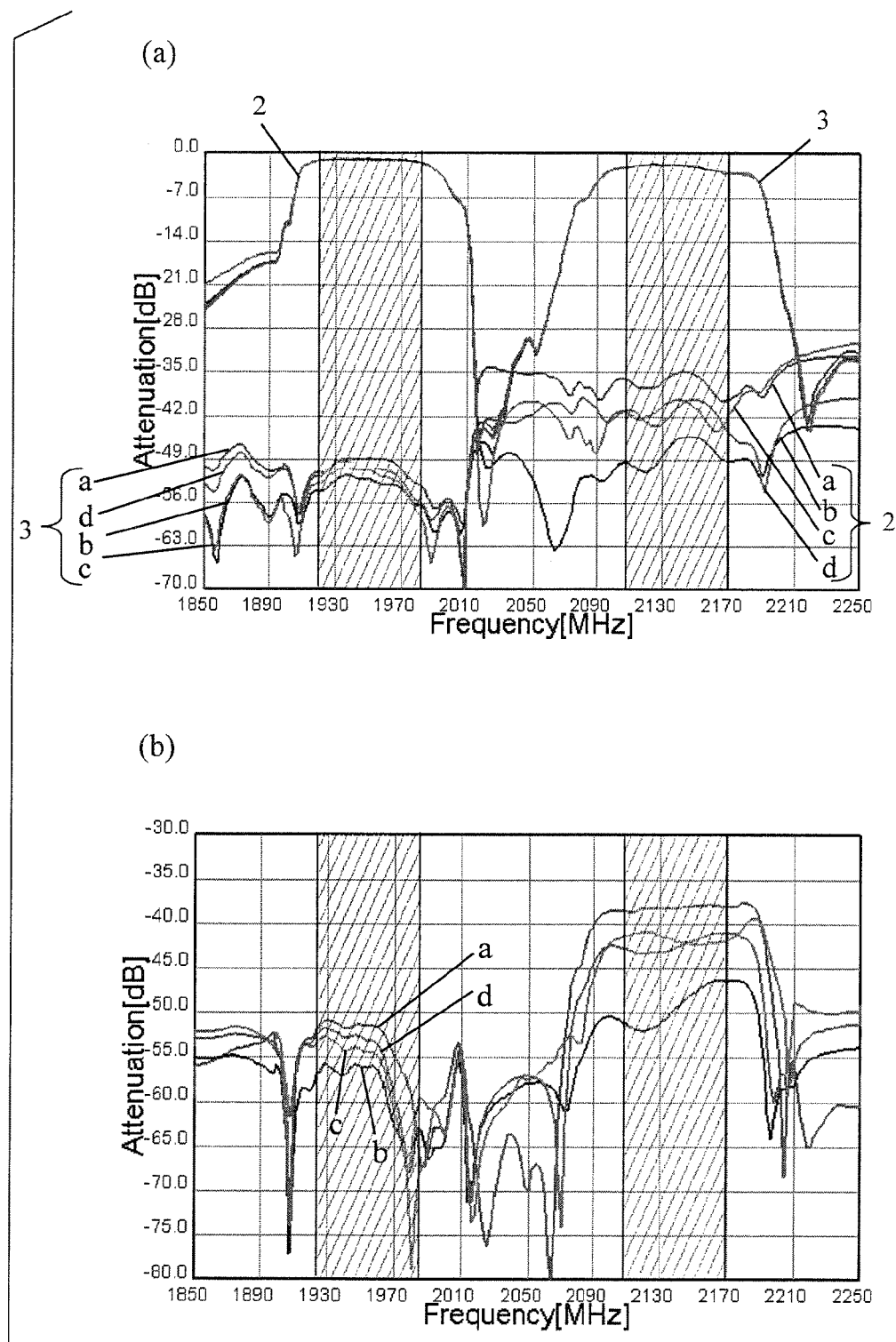
FIG. 8 shows graphs for illustrating the passing characteristic and the isolation characteristic of the antenna duplexer including the packages shown in FIG. 7.

FIGS. 8(a) and 8(b) shows the passing characteristic and the isolation characteristic of the antenna duplexer including the four packages shown in FIGS. 7(a) to 7(d). The codes designating the waveshape correspond to those of the packages shown in FIGS. 7(a) to 7(d).

FIG. 8(a) shows the passing characteristic of the transmit filter and the receive filter of the four packages shown in FIG. 7(a) to D.

As is apparent from FIG. 8(a), the attenuation of the transmit filter 2 in the receiving band (2110 MHz to 2170 MHz, hatched with diagonal lines) is approx. 35 dB in the package of FIG. 7(a), approx. 43 dB in the package of 7(b), and approx. 40 dB in the packages of 7(c) and 7(d). On the other hand, the attenuation of the receive filter 3 in the transmitting band (1920 MHz to 1980 MHz, hatched with diagonal lines) is similar among the packages of 7(a) to 7(d), out of which the package of 7(b) shows a largest value exceeding 50 dB.

FIG. 8(b) shows the isolation characteristic between the transmit terminal 8 and the receive terminal 9 of the four packages shown in FIGS. 7(a) to 7(d).

In view of FIG. 8(b), it is understood that the package of FIG. 7(b) exhibits highest isolation performance in both of the transmitting band (1920 MHz to 1980 MHz, hatched with diagonal lines) and the receiving band (2110 MHz to 2170 MHz, hatched with diagonal lines). Specifically, the package of 7(b) achieves the isolation of approx. 57 dB to 67 dB in the transmitting band, and approx. 46 dB to 53 dB in the receiving band.

From FIGS. 8(a) and 8(b), it is apparent that the package of FIG. 7(b) (package according to the first embodiment) exhibits highest performance in passing characteristic and isolation characteristic, which proves that the structure according to the first embodiment, in which the metal lid and the seal ring are connected to the ground patterns 142, 152 of the receive filter 3 through the side castellation, provides an antenna duplexer having excellent attenuation and isolation characteristic, and of significantly reduced dimensions including the height.

Figure 9:
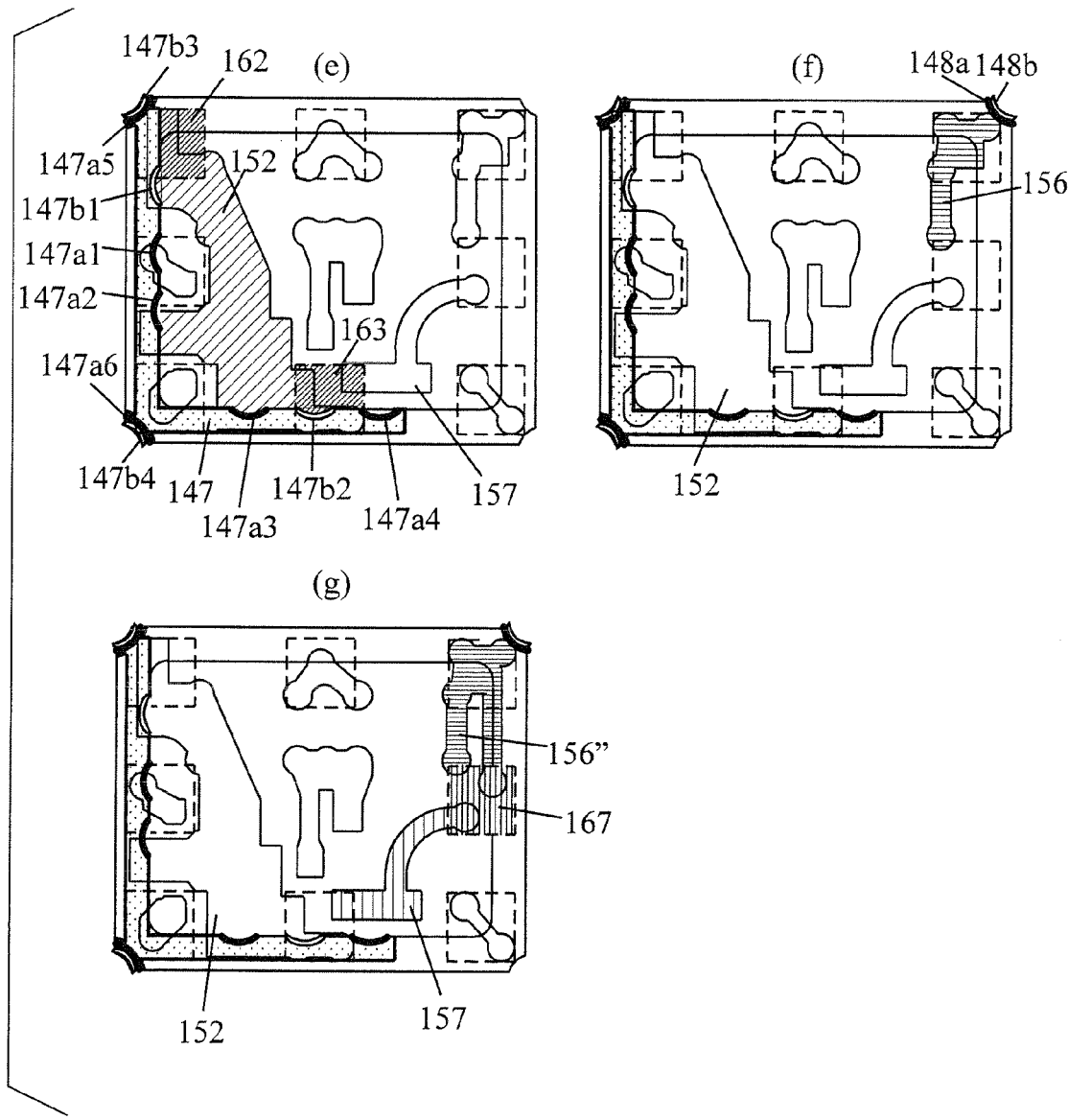
FIG. 9 shows packages with different connection manners for connecting ground patterns.

FIG. 9(e) to 9(g) illustrates three types of packages with different connection methods between the ground patterns.

In the packages shown in FIGS. 9(e) to 9(g), the side castellations 147b1, 147b2 on the inner wall of the second cavity layer 120 are of the same structure and located at the same position as the side castellations 141b, 142b of the first embodiment. However, the packages of FIGS. 9(e) to 9(g) are different from that of the first embodiment in that four side castellations 147a1 to 147a4 are provided on the inner wall of the first cavity layer 110, that the side castellations 147a5, 147a6, 147b3, 147b4 are provided on the outer wall of the cavity layers 110, 120, and that these side castellations are all connected through a single connection pattern 147. Here, the side castellations on the inner wall of the first cavity layer 110 and the second cavity layer 120 of the packages of FIGS. 9(e) to 9(g) are of the same structure.

In the package shown in FIG. 9(e), the ground pattern 152 of the receive filter 3 is separated from the ground patterns 156, 157 in the package 100. In the package shown in FIG. 9(f), the side castellations 148a, 148b are provided at corners of the outer wall of the first cavity layer 110 and the second cavity layer 120. The side castellations 148a, 148b connect the metal lid 200 and the seal ring 600 with the ground pattern 156 of the matching circuit 4. Accordingly, the ground pattern 152 of the receive filter 3 is connected to the ground pattern 156 of the matching circuit 4, in the package 100. The ground pattern 152 of the receive filter 3 is separated from the ground pattern 157 of the transmit filter 2.

Further, in the packages shown in FIG. 9(g), the ground pattern 156" of the matching circuit 4 formed on the upper surface of the second base layer 140, as in FIG. 9(f), is extended to the footpad for ground 167 of the transmit filter 2. Accordingly, the ground pattern 156" of the matching circuit 4 is connected to the ground pattern 157 of the transmit filter 2. Thus, in the package 100, the ground pattern 152 of the receive filter 3, the ground pattern 156" of the matching circuit 4, and the ground pattern 157 of the transmit filter are all connected.

Figure 10:
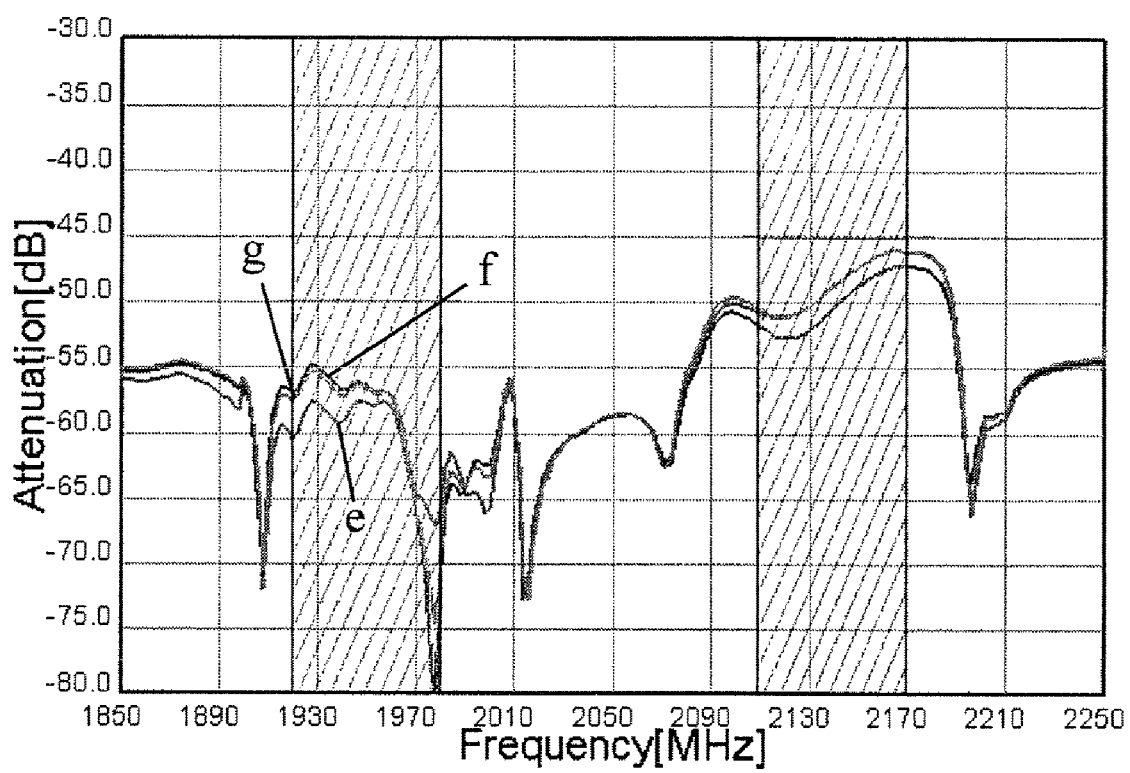
FIG. 10 is a graph showing the isolation characteristic of the antenna duplexer including the packages shown in FIGS. 9(e) to 9(g)

FIG. 10 is a graph showing the isolation characteristic of the antenna duplexer including the packages shown in FIGS. 9(e) to 9(g). The codes designating the waveshape correspond to those of the packages shown in FIGS. 9(e) to 9(g).

It appears that the package of FIG. 9(f) exhibits best isolation performance in the receiving band (2110 MHz to 2170 MHz, hatched with diagonal lines), however this is because the value of the inductor L1 of the ground pattern of the transmit filter 2 has fluctuated toward an optimal value, and actually there is no substantial difference from other ground patterns. Referring to the isolation in the transmitting band (1920 MHz to 1980 MHz, hatched with diagonal lines), the package of FIG. 9(e) shows highest performance. The ground pattern 152 of the receive filter 3 attains a better isolation characteristic when separated from other ground pattern in the package 100.

Figure 11:
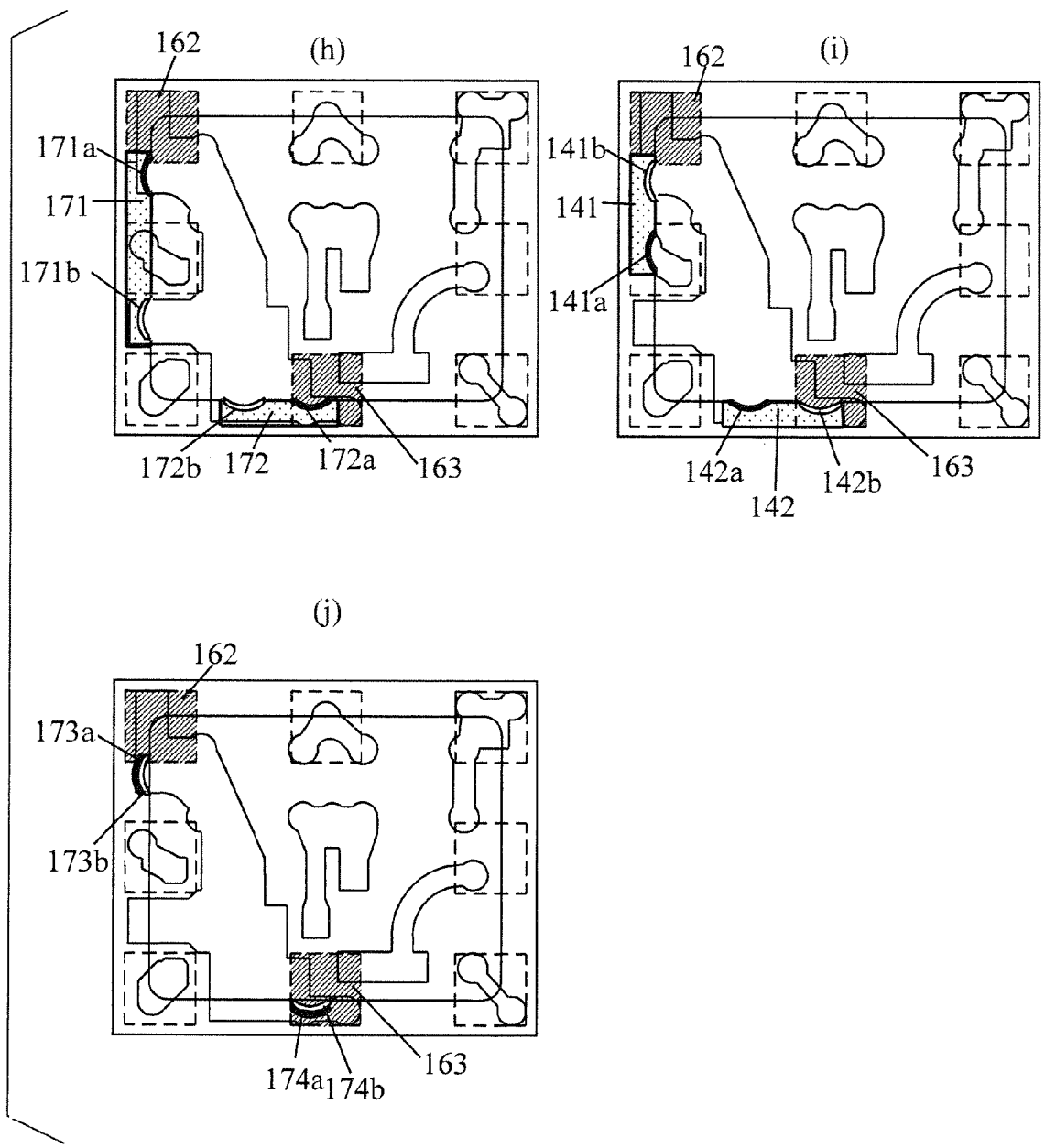
FIG. 11 shows packages with different layouts of side castellation formed on the first cavity layer and the second cavity layer.

FIG. 11(h) to 11(j) illustrates three types of packages with different layouts of the side castellation formed on the first cavity layer and the second cavity layer.

The package of FIG. 11(i) is the package according to the first embodiment, in which a part of the side castellations 141b, 142b formed on the second cavity layer 120 is disposed so as to oppose the footpads 162, 163 for the ground of the receive filter 3.

In the package of FIG. 11(h), a part of the side castellations 171a, 172a formed on the first cavity layer 110, or of connection patterns 171, 172 of the side castellation is disposed so as to oppose the footpads 162, 163 for the ground of the receive filter 3. However, a part of the side castellations 171b, 172b formed on the second cavity layer 120 is not oriented so as to oppose the footpads 162, 163 for the ground of the receive filter 3.

In the package of FIG. 11(j), the side castellations 173b, 174b of the second cavity layer 120 are located at the same position as the side castellations 141b, 142b of the second cavity layer 120 shown in FIG. 11(i), however the difference lies in that the side castellation 173a, 174a of the first cavity layer 110 are respectively located right above the side castellations 173b, 174b, so that the side castellations of the first cavity layer 110 and those of the second cavity layer 120 are linearly aligned. In this case also, a part of the side castellations formed in the first cavity layer 110 and the second cavity layer 120 is disposed so as to oppose the footpads 162, 163 for the ground of the receive filter 3. Here, in the case of linearly orienting the side castellations, some measures have to be taken to prevent the solder from dripping.

Figure 12:
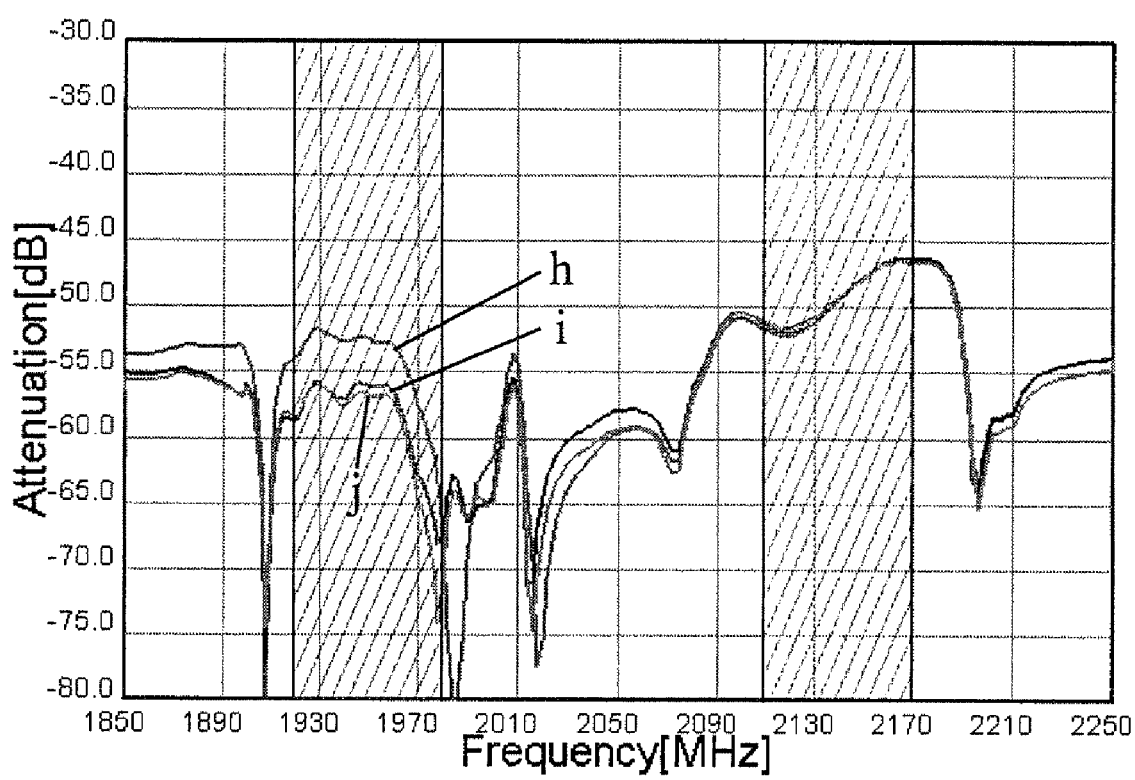
FIG. 12 is a graph showing the isolation characteristic of the antenna duplexer including the packages shown in FIG. 11(h)-(j)

FIG. 12 is a graph showing the isolation characteristic of the antenna duplexer including the three packages shown in FIGS. 11(h) to 11(j). The codes designating the waveshape correspond to those of the packages shown in FIGS. 11(h) to 11(j).

The packages shown in FIGS. 11(i) and 11(j) exhibit a better isolation characteristic in the transmitting band (1920 MHz to 1980 MHz, hatched with diagonal lines), than the package of FIG. 11(h). This proves that in the case where a part of the side castellation leading to the die-attach surface is oriented so as to oppose the footpads 162, 163 for the ground of the receive filter 3, a higher isolation characteristic is attained.

Figure 13:
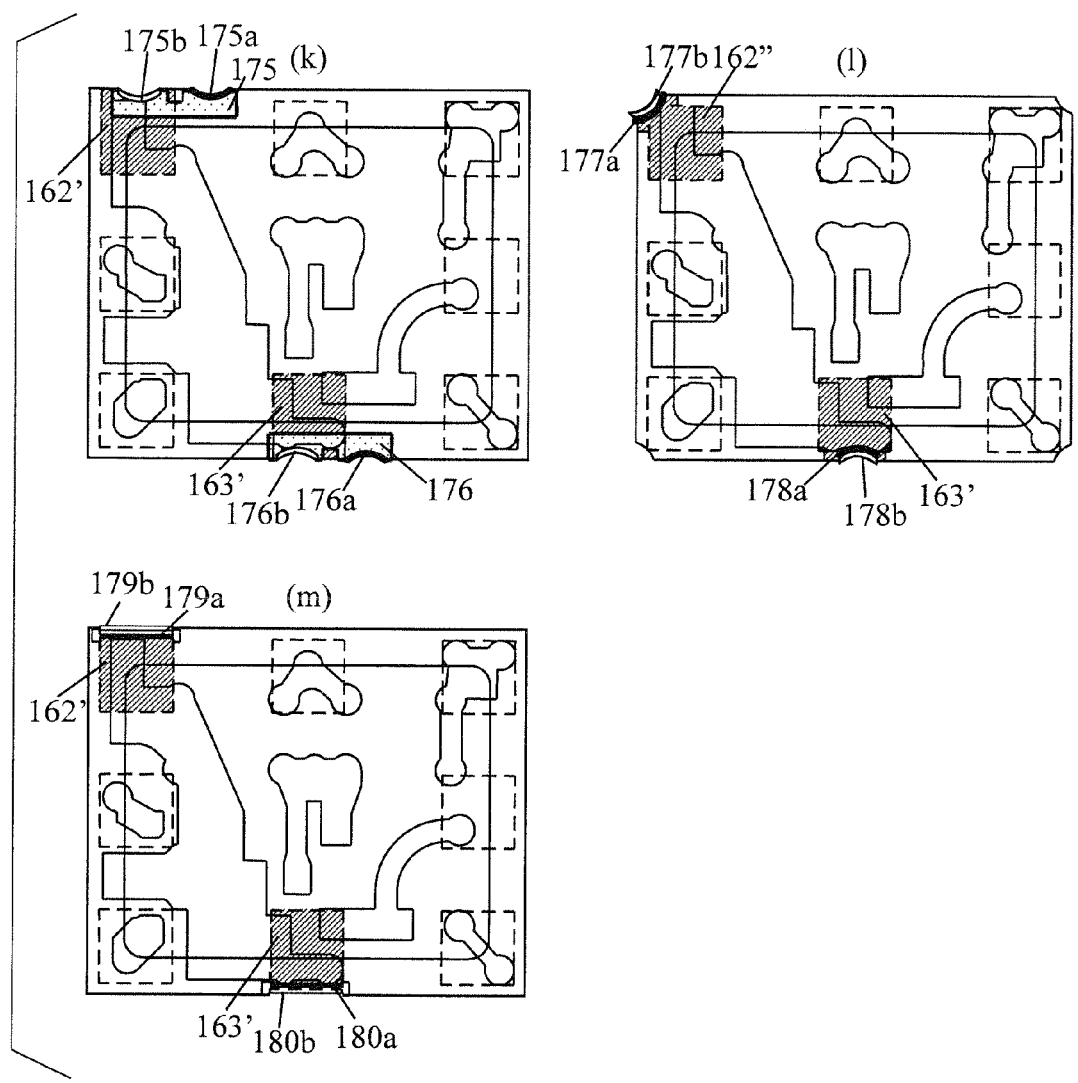
FIG. 13 shows packages with different layouts of side castellation formed on the first cavity layer and the second cavity layer.

FIG. 13(k) to 13(m) illustrates three types of packages with different layouts of the side castellation formed on the first cavity layer 110 and the second cavity layer 120, as well as on the first base layer 130 and the second base layer 140.

In all the three types of packages, at least a part of the side castellation formed on the outer wall or of a connection pattern of the side castellation is oriented so as to oppose the footpad for the ground of the receive filter, and at least a part of the side castellation formed on the outer wall is directly connected to the footpad for the ground of the receive filter. Here the footpad for the ground of the receive filter is of a different shape from that of the package according to the first embodiment, to achieve the direct connection with the side castellation provided on the outer wall.

In the package shown in FIG. 13(k), the side castellations 175a, 176a formed in the first cavity layer 110 and the side castellations 175b, 176b formed in the second cavity layer 120, the first base layer 130, and the second base layer 140 are located at different positions, and connected through connection patterns 175, 176 on the upper surface of the second cavity layer 120. In both of the packages shown in FIGS. 13(l) and 13(m), the side castellations in the first cavity layer 110, the second cavity layer 120, the first base layer 130, and the second base layer 140 are linearly aligned. On the other hand, the packages of FIGS. 13(l) and 13(m) are different in that the side castellations 177a, 177b of the former are located at a corner portion, and that in the latter the side castellations 179a, 179b, 180a, 180b are larger in width than those of the former.

Figure 14:
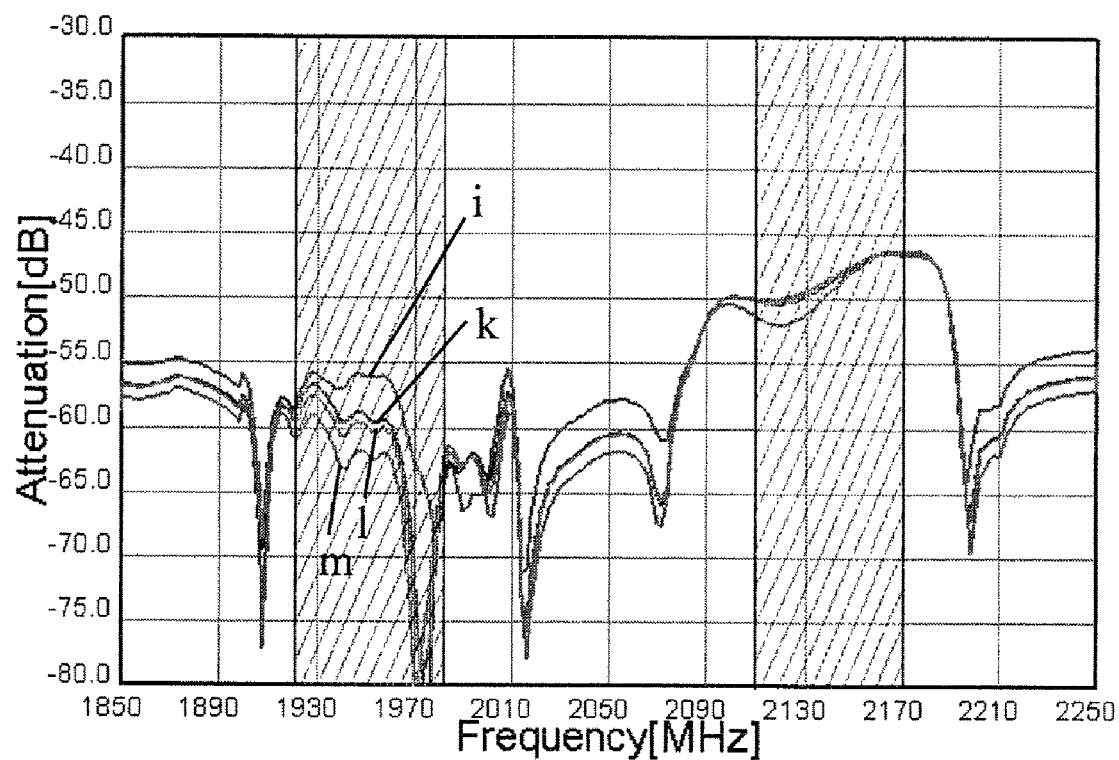
FIG. 14 is a graph showing the isolation characteristic of the antenna duplexer including the packages shown in FIG. 13(k)-(m)

FIG. 14 is a graph showing the isolation characteristic of the antenna duplexer including the three types of packages shown in FIGS. 13(k) to 13(m). FIG. 14 also includes the isolation characteristic of the antenna duplexer including the package shown in FIG. 11(i) (according to the first embodiment), for comparison purpose. The codes designating the waveshape correspond to those of the packages shown in FIGS. 11(i) and 13(k) to 13(m).

FIG. 14 proves that the packages shown in FIGS. 13(k) to 13(m) including the side castellations formed on the outer wall provide higher isolation characteristic in the transmitting band (1920 MHz to 1980 MHz, hatched with diagonal lines), than the package of FIG. 11(i) including the side castellation formed on the inner wall. It is also understood that forming a wider side castellation on the outer wall allows further improving the isolation characteristic.

Figure 15:
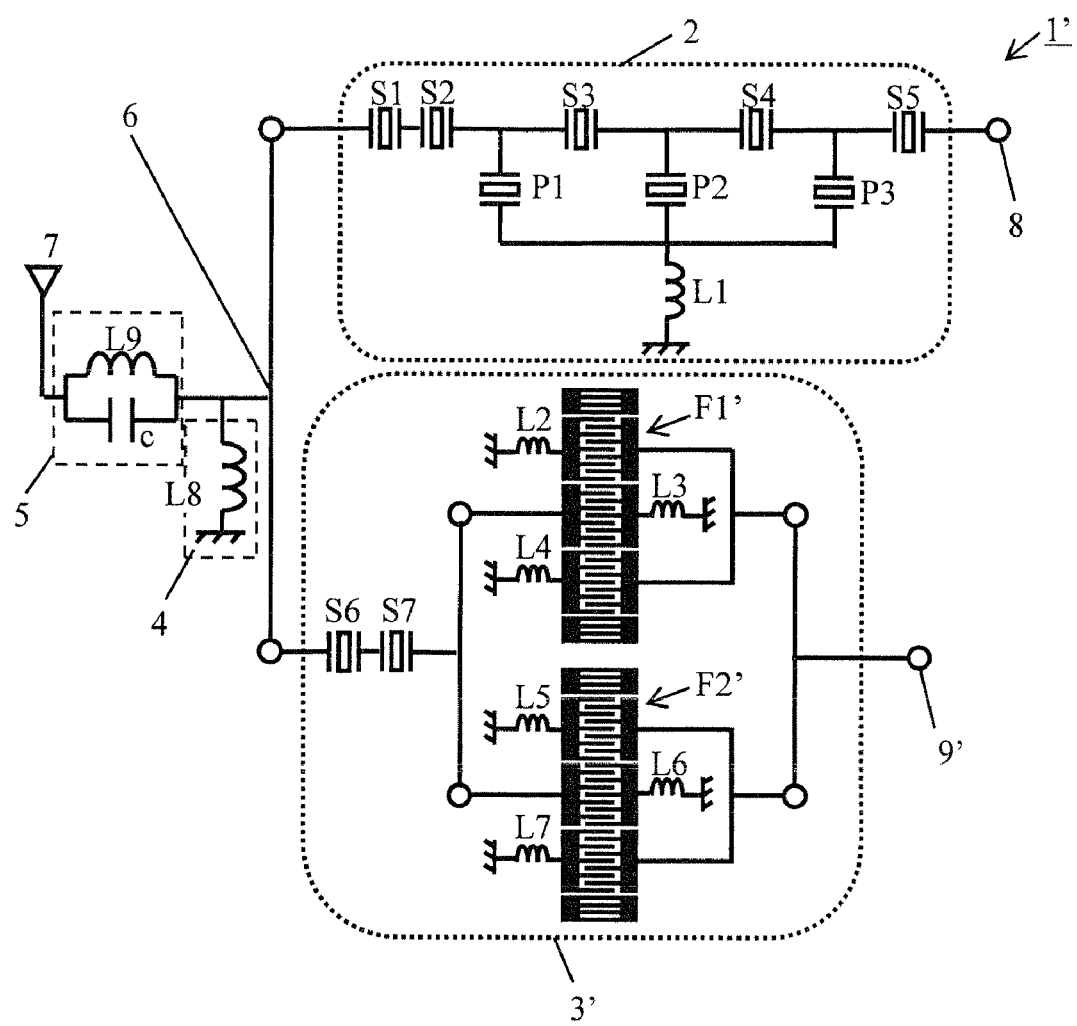
FIG. 15 is a circuit diagram of an antenna duplexer according to a second embodiment of the present invention.

FIG. 15 is a circuit diagram of an antenna duplexer according to a second embodiment of the present invention.

The antenna duplexer 1' according to the second embodiment is different from the antenna duplexer 1 shown in FIG. 1 in the structure of the receive filter 3'. More specifically, the receive terminal 9' of the receive filter 3' is unbalanced. Accordingly, to obtain an unbalanced output from the receive terminal, the IDTs of the double mode type surface acoustic wave filters F1' and F2' are disposed in the same layout.

Figure 16:
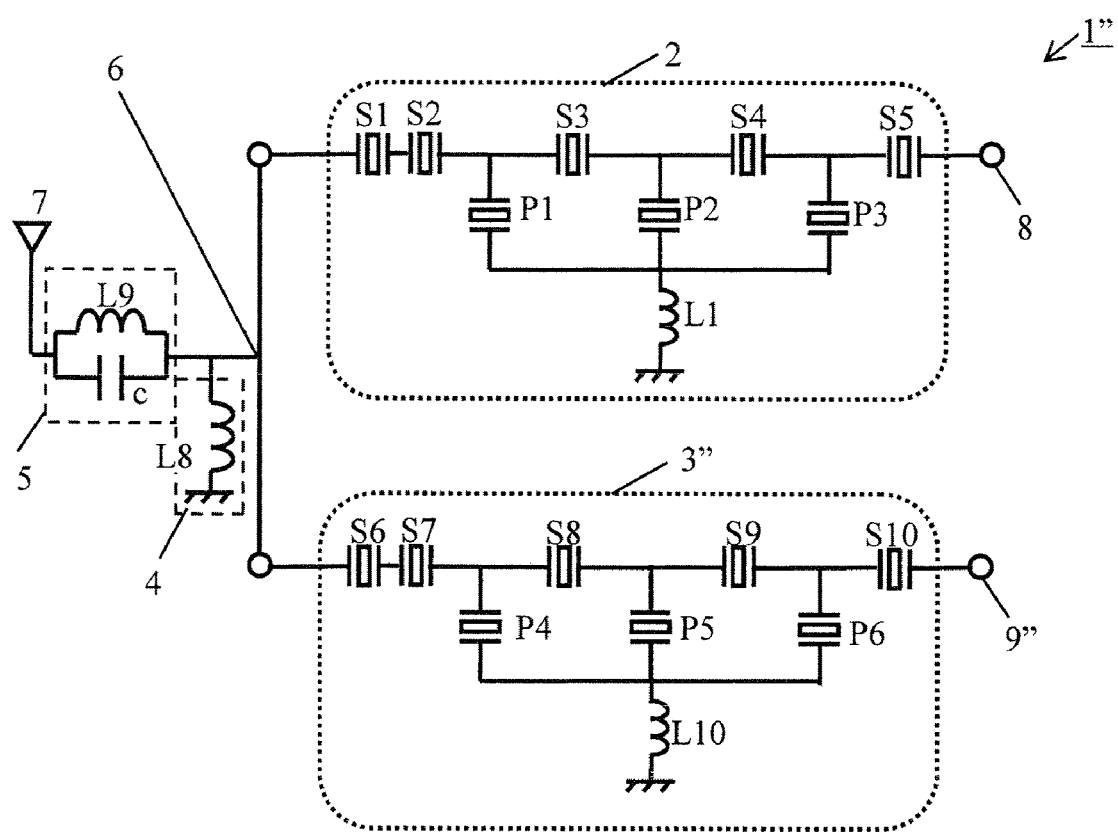
FIG. 16 is a circuit diagram of an antenna duplexer according to a third embodiment of the present invention.
Figure 17:
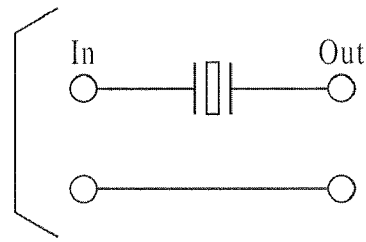
FIG. 17 is a schematic diagram showing a one terminal-pair resonator.
Figure 18A:
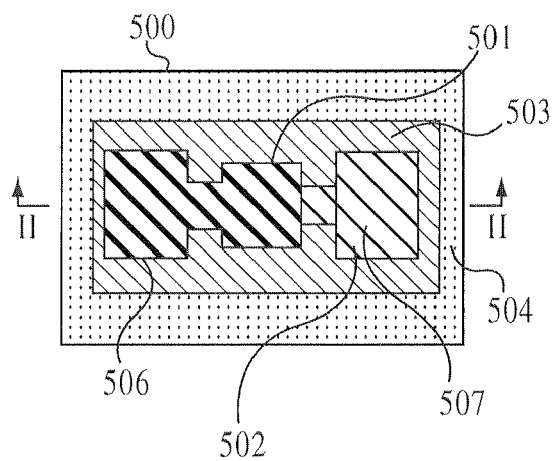
FIG. 18 illustrates the basic structure of a piezoelectric thin film resonator.
Figure 18B:
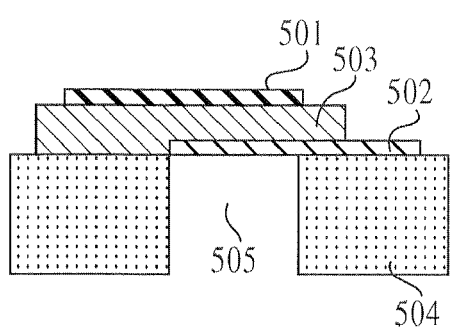
Figure 18C:
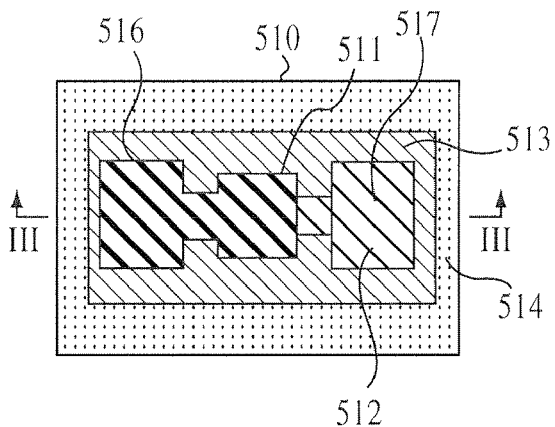
Figure 18D:
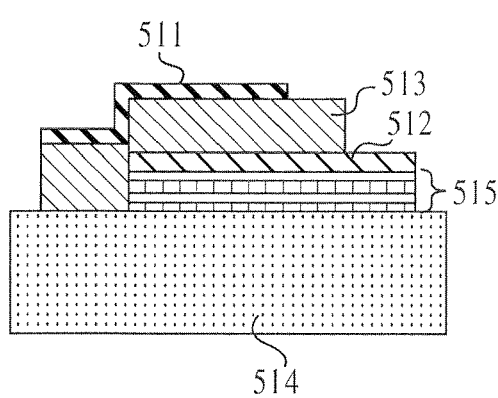
Figure 19A:
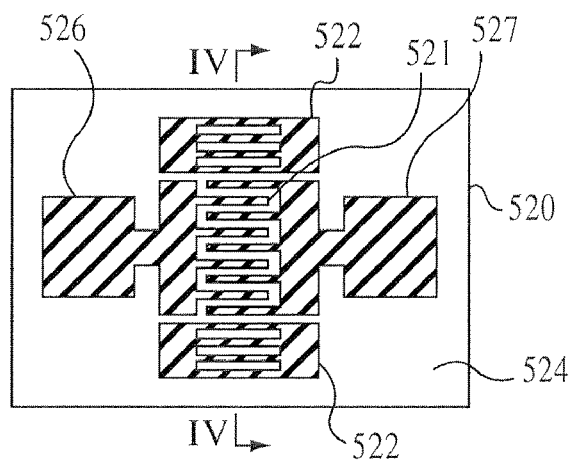
FIG. 19 illustrates the basic structure of a surface acoustic wave resonator.
Figure 19B:
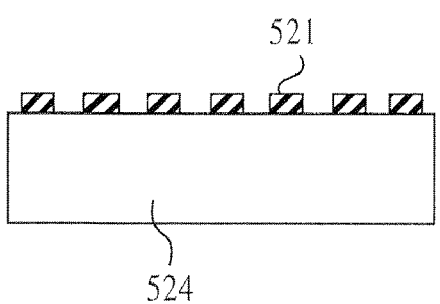
Figure 20A:
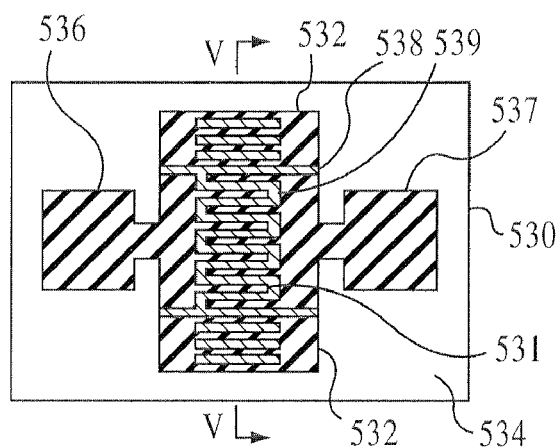
FIG. 20 illustrates the basic structure of a boundary wave resonator.
Figure 20B:
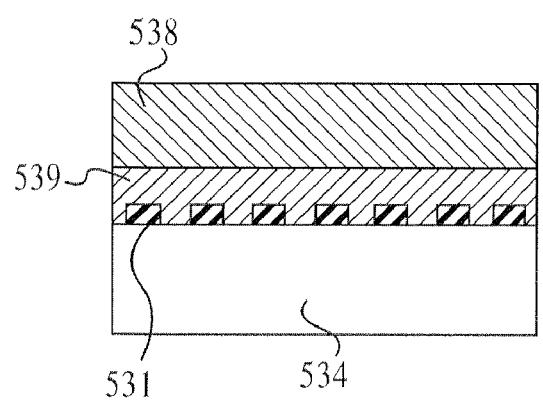
Figure 21:
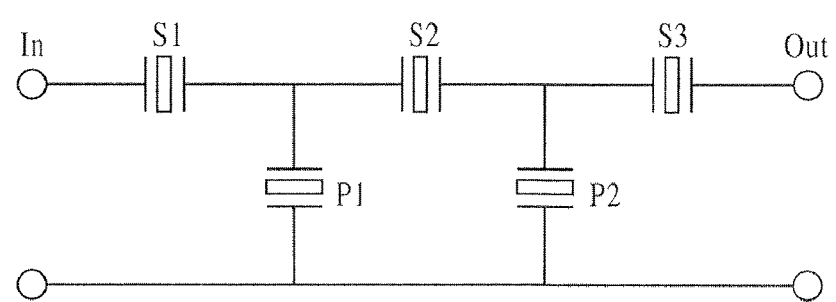
FIG. 21 is a circuit diagram for explaining a ladder-type filter.
Figure 22:
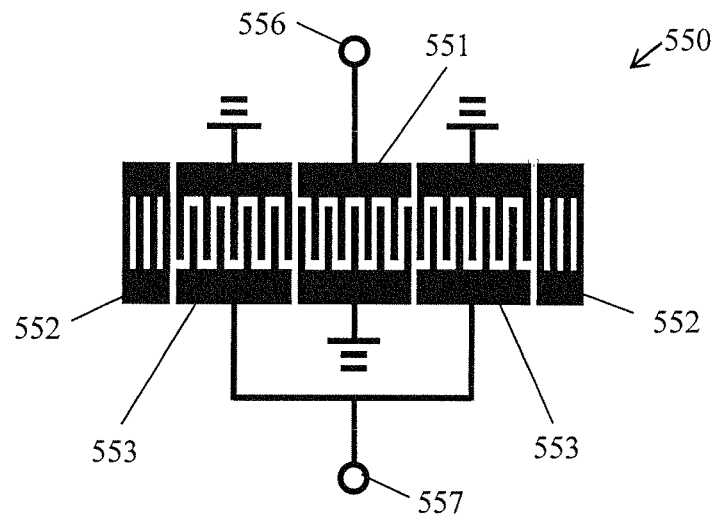
FIG. 22 is a schematic diagram for explaining an unbalanced double mode type surface acoustic wave filter.
Figure 23:
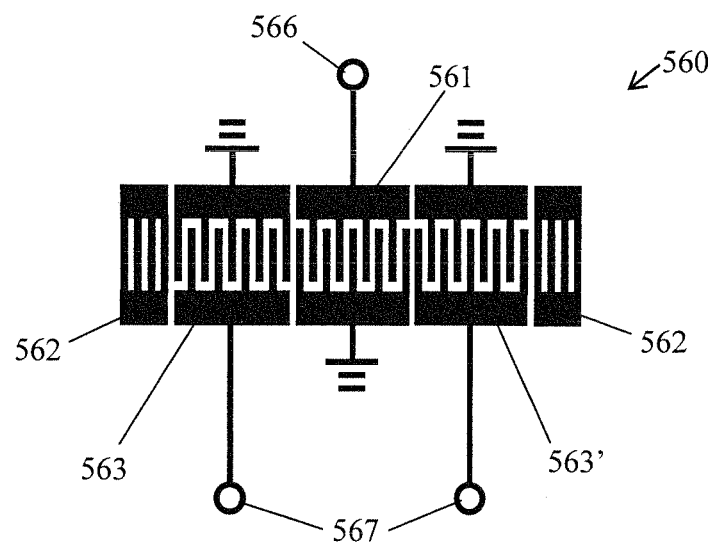
FIG. 23 is a schematic diagram for explaining a balanced/unbalanced-convertible double mode type surface acoustic wave filter.
Figure 24:
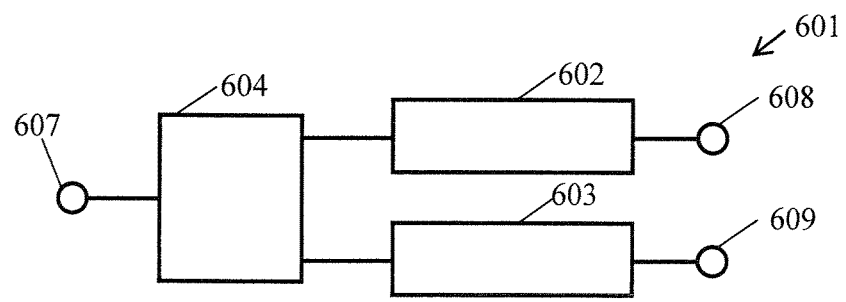
FIG. 24 is a block diagram for explaining a basic structure of the antenna duplexer.
Figure 25:
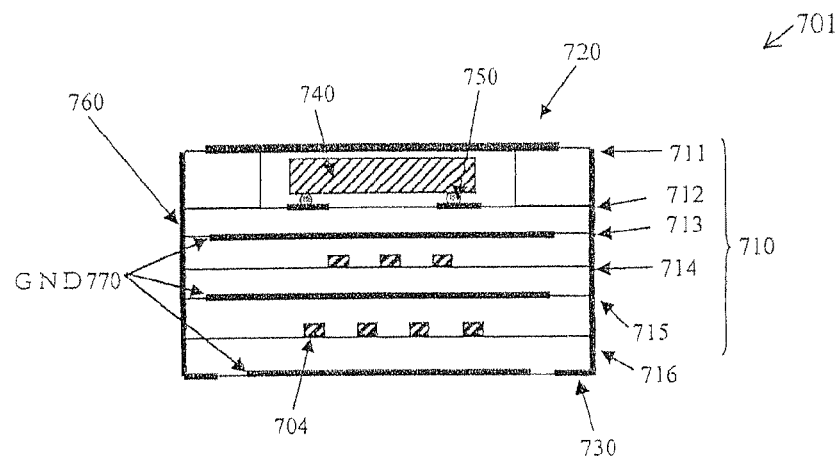
FIG. 25 is a schematic side view showing an internal structure of a conventional antenna duplexer.
Figure 26:
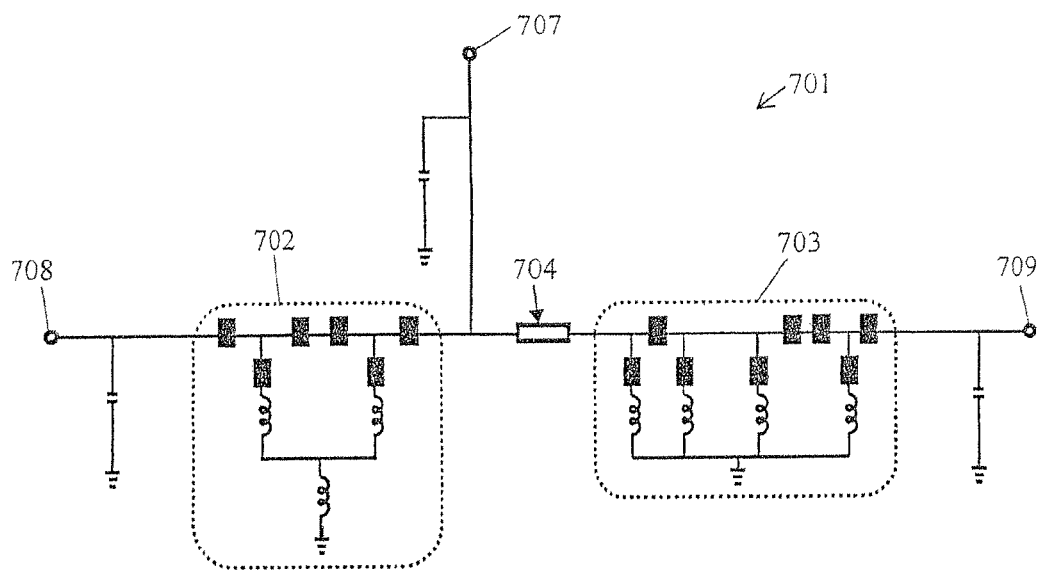
FIG. 26 is a circuit diagram of the antenna duplexer shown in FIG. 25.

FIG. 16 is a circuit diagram of an antenna duplexer according to a third embodiment of the present invention.

A difference of the antenna duplexer 1" according to the third embodiment from the antenna duplexer 1 shown in FIG. 1 also lies in the structure of the receive filter 3'. More specifically, a ladder-type filter constituting the transmit filter 2 is also employed as the receive filter 3'. In the antenna duplexer 1" according to the third embodiment also, the receive terminal 9" of the receive filter 3" is unbalanced.

The circuit configuration according to the second and the third embodiment provides an antenna duplexer in which the antenna terminal, the transmit terminal, and the receive terminal are all unbalanced. The details of the circuit configuration are the same as those of the first embodiment, and hence will not be repeated.

Thus, the present invention provides an antenna duplexer of a significantly smaller size and lower height than ever, yet capable of achieving higher out-of-band attenuation and isolation characteristic between a transmit terminal and a receive terminal, through innovation in side castellation layout in the package.

The foregoing embodiments may be defined in the following appendices.

Appendix 1. An antenna duplexer comprising a transmit filter provided between an antenna terminal and a transmit terminal, and a receive filter provided between the antenna terminal and a receive terminal, the transmit filter and the receive filter being mounted in a package, wherein a ground pattern for the receive filter is separated from another ground pattern in the package.

Appendix 2. The antenna duplexer according to appendix 1, wherein the package includes a cavity portion that accommodates therein the transmit filter and the receive filter, and a seal ring portion, and the seal ring portion is connected to the ground pattern for the receive filter.

Appendix 3. The antenna duplexer according to appendix 2, wherein connection of the seal ring portion and the ground pattern for the receive filter is made through a conductor pattern including a side castellation formed on an inner wall of the package.

Appendix 4. The antenna duplexer according to appendix 2 or 3, wherein connection of the seal ring portion and the ground pattern for the receive filter is made through a conductor pattern including a side castellation formed on an outer wall of the package.

Appendix 5. The antenna duplexer according to appendix 3 or 4, wherein the package includes at least two side castellations.

Appendix 6. The antenna duplexer according to any one of appendices 3 to 5, wherein a sidewall of the cavity portion includes a plurality of layers; the side castellations formed on the respective layers are connected through a connection pattern formed on a boundary between the layers; and at least a part of the side castellation or of the connection pattern is oriented so as to oppose the footpad for the ground of the receive filter formed on a lower face of the package.

Appendix 7. The antenna duplexer according to appendix 6, wherein the facing portion includes at least a part of the side castellation directly connected to a die-attach surface where the transmit filter and the receive filter in the cavity portion are mounted.

Appendix 8. The antenna duplexer according to appendix 6 or 7, wherein at least a part of the side castellation is directly connected to the footpad for the ground of the receive filter.

Appendix 9. The antenna duplexer according to any one of appendices 1 to 8, wherein the ground pattern of the transmit filter includes a conductor pattern on the die-attach surface in the package, a conductor pattern formed on a lower layer surface of the die-attach surface, and a via that connects the two conductor patterns.

Appendix 10. The antenna duplexer according to any one of appendices 1 to 9, wherein the ground pattern of the receive filter includes a conductor pattern on the die-attach surface in the package, a conductor pattern formed on a lower layer surface of the die-attach surface, and a via that connects the two conductor patterns.

Appendix 11. The antenna duplexer according to appendix 10, wherein the ground pattern of the receive filter includes at least two vias.

Appendix 12. The antenna duplexer according to any one of appendices 1 to 11, wherein the ground for the receive filter includes at least two footpads, in the package.

Appendix 13. The antenna duplexer according to any one of appendices 1 to 12, wherein at least two vias are connected to at least one of the footpads for the the receive filter ground, in the package.

Appendix 14. An antenna duplexer comprising a transmit filter provided between an antenna terminal and a transmit terminal, and a receive filter provided between the antenna terminal and a balanced receive terminal, the transmit filter and the receive filter being mounted in a package, wherein the transmit filter is a ladder-type filter, and the receive filter includes a plurality of parallelly connected double mode type filters, and a plurality of resonators serially connected between the double mode type filter and the antenna terminal.

Appendix 15. The antenna duplexer according to appendix 14, wherein the transmit filter includes a plurality of serial resonators located on the side of the antenna terminal.

Appendix 16. The antenna duplexer according to appendix 14 or 15, wherein the resonator constituting the ladder-type transmit filter is a piezoelectric thin film resonator.

Appendix 17. The antenna duplexer according to any one of appendices 14 to 16, further comprising an in inductor connected in parallel between a common coupling point of the transmit filter and the receive filter, and the antenna terminal.

Appendix 18. The antenna duplexer according to any one of appendices 14 to 17, further comprising a notch circuit serially connected between the common coupling point of the transmit filter and the receive filter and the antenna terminal.

Appendix 19. The antenna duplexer according to any one of appendices 1 to 13, wherein the transmit filter is a ladder-type filter.

Appendix 20. The antenna duplexer according to appendix 19, wherein the ladder-type filter includes a plurality of parallel resonators, and an inductor is inserted after communization of a ground-side terminal of the plurality of parallel resonators.

Appendix 21. The antenna duplexer according to appendix 19 or 20, wherein a resonator of the transmit filter on the side of the antenna terminal is a serial resonator.

Appendix 22. The antenna duplexer according to any one of appendices 1 to 13 and 19 to 21, wherein the transmit terminal of the transmit filter is unbalanced.

Appendix 23. The antenna duplexer according to any one of appendices 1 to 13 and 19 to 22, wherein the receive filter is a ladder-type filter.

Appendix 24. The antenna duplexer according to any one of appendices 1 to 13 and 19 to 22, wherein the receive filter includes a longitudinal mode coupled filter.

Appendix 25. The antenna duplexer according to appendix 24, wherein the receive filter further includes a resonator serially connected between the longitudinal mode coupled filter and the antenna terminal.

Appendix 26. The antenna duplexer according to appendix 24 or 25, wherein the longitudinal mode coupled filter is constituted of a plurality of parallelly connected double mode type filters.

Appendix 27. The antenna duplexer according to any one of appendices 1 to 13 and 19 to 26, wherein the receive terminal of the receive filter is unbalanced.

Appendix 28. The antenna duplexer according to any one of appendices 1 to 13, 19 to 22, and 24 to 26, wherein the receive terminal of the receive filter is balanced.

Appendix 29. The antenna duplexer according to any one of appendices 1 to 13 and 19 to 28, wherein the resonator employed in the transmit filter or the receive filter is constituted of one of a piezoelectric thin film resonator, a surface acoustic wave resonator, and a boundary wave resonator.

Appendix 30. The antenna duplexer according to any one of appendices 1 to 13 and 19 to 29, wherein at least two resonators are serially connected in at least one of the transmit filter and the receive filter including the serial resonators on the side of the antenna terminal.

Appendix 31. The antenna duplexer according to any one of appendices 24 to 30, wherein the longitudinal mode coupled filter employed in the receive filter is used in one of the surface acoustic wave mode and the boundary wave mode.

Appendix 32. The antenna duplexer according to any one of appendices 1 to 13 and 19 to 31, further comprising a chip constituted of an integrated passive element.

Appendix 33. The antenna duplexer according to appendix 32, wherein the integrated passive element includes at least a matching circuit.

Appendix 34. The antenna duplexer according to appendix 32 or 33, wherein the integrated passive element includes at least a notch circuit.

The invention claimed is:

1. An antenna duplexer comprising:
 a transmit filter provided between an antenna terminal and a transmit terminal;
 a receive filter provided between the antenna terminal and a receive terminal; and
 a package for mounting the transmit filter and the receive filter;
 wherein the package is internally provided with a ground pattern for the receive filter and another ground pattern in the package, the ground pattern for the receive filter being electrically separated from said another ground pattern;
 wherein the ground for the receive filter includes at least two footpads in the package.

2. The antenna duplexer according to claim 1, wherein the package includes a cavity portion for accommodating the transmit filter and the receive filter, and a seal ring portion connected to the ground pattern for the receive filter.

3. The antenna duplexer according to claim 2, wherein the seal ring portion and the ground pattern for the receive filter is connected through a conductor pattern including a side castellation formed on an inner wall of the package.

4. The antenna duplexer according to claim 3, wherein the package includes at least two side castellations.

5. The antenna duplexer according to claim 1, wherein the ground pattern of the transmit filter includes a conductor pattern on the die-attach surface in the package, a conductor pattern formed on a lower layer surface of the die-attach surface, and a via that connects the two conductor patterns.

6. The antenna duplexer according to claim 1, wherein the ground pattern of the receive filter includes a conductor pattern on the die-attach surface in the package, a conductor pattern formed on a lower layer surface of the die-attach surface, and a via that connects the two conductor patterns.

7. The antenna duplexer according to claim 6, wherein the ground pattern of the receive filter includes at least two vias.

8. An antenna duplexer comprising:
a transmit filter provided between an antenna terminal and a transmit terminal;
a receive filter provided between the antenna terminal and a receive terminal; and
a package for mounting the transmit filter and the receive filter;
wherein the package is internally provided with a ground pattern for the receive filter and another ground pattern in the package, the ground pattern for the receive filter being electrically separated from said another ground pattern;
wherein the package includes a cavity portion for accommodating the transmit filter and the receive filter, and a seal ring portion connected to the ground pattern for the receive filter;
wherein the seal ring portion and the ground pattern for the receive filter is connected through a conductor pattern including a side castellation formed on an outer wall of the package.

9. An antenna duplexer comprising:
a transmit filter provided between an antenna terminal and a transmit terminal;
a receive filter provided between the antenna terminal and a receive terminal; and
a package for mounting the transmit filter and the receive filter;
wherein the package is internally provided with a ground pattern for the receive filter and another ground pattern in the package, the ground pattern for the receive filter being electrically separated from said another ground pattern;
wherein the package includes a cavity portion for accommodating the transmit filter and the receive filter, and a seal ring portion connected to the ground pattern for the receive filter;
wherein the seal ring portion and the ground pattern for the receive filter is connected through a conductor pattern including a side castellation formed on an inner wall of the package;
wherein the cavity portion includes a side wall made up of a plurality of layers, the side castellations being formed on the respective layers and connected through a connection pattern formed on a boundary between the layers, at least part of the side castellation or the connection pattern is arranged to face a footpad for the ground of the receive filter, the footpad being formed on a lower face of the package.

10. The antenna duplexer according to claim 9, wherein the facing portion includes at least a part of the side castellation directly connected to a die-attach surface where the transmit filter and the receive filter in the cavity portion are mounted.

11. The antenna duplexer according to claim 9, wherein at least part of the side castellation is directly connected to the footpad for the ground of the receive filter.

12. An antenna duplexer comprising:
a transmit filter provided between an antenna terminal and a transmit terminal;
a receive filter provided between the antenna terminal and a receive terminal; and
a package for mounting the transmit filter and the receive filter;
wherein the package is internally provided with a ground pattern for the receive filter and another ground pattern in the package, the ground pattern for the receive filter being electrically separated from said another ground pattern;
wherein the ground for the receive filter includes at least two footpads in the package; and
wherein at least two vias are connected to at least one of the footpads for the receive filter ground in the package.

* * * * *